US012572022B2

(12) United States Patent
Pierer et al.

(10) Patent No.: US 12,572,022 B2
(45) Date of Patent: *Mar. 10, 2026

(54) COMPACT OPTICAL ENGINE AND METHOD OF MANUFACTURING SAME

(71) Applicant: GOOGLE LLC, Mountain View, CA (US)

(72) Inventors: Jörg Pierer, Alpnach (CH); Rony Jose James, Alpnach (CH); Stefan Mohrdiek, Affoltern am Albis (CH); Douglas R. Dykaar, Waterloo (CA); Martin Joseph Kiik, Waterloo (CA); Syed Moez Haque, Kitchener (CA)

(73) Assignee: GOOGLE LLC, Mountain View, CA (US)

( * ) Notice: Subject to any disclaimer, the term of this patent is extended or adjusted under 35 U.S.C. 154(b) by 1088 days.

This patent is subject to a terminal disclaimer.

(21) Appl. No.: 17/579,051

(22) Filed: Jan. 19, 2022

(65) Prior Publication Data

US 2022/0137420 A1 May 5, 2022

Related U.S. Application Data

(63) Continuation of application No. 16/201,770, filed on Nov. 27, 2018, now abandoned.

(Continued)

(51) Int. Cl.
*G02B 27/01* (2006.01)
*G02B 27/42* (2006.01)
(Continued)

(52) U.S. Cl.
CPC ..... *G02B 27/0176* (2013.01); *G02B 27/0172* (2013.01); *G02B 27/4205* (2013.01);
(Continued)

(58) Field of Classification Search
CPC ........... G02B 19/0014; G02B 19/0052; G02B 19/009; G02B 26/101; G02B 27/0176; G02B 27/0172; G02B 27/0911; G02B 27/0916; G02B 27/102; G02B 27/1086; G02B 27/4205; G02B 2027/015; G02B 2027/0178; H01S 5/02224; H01S 5/02253; H01S 5/02255; H01S 5/02257;
(Continued)

(56) References Cited

U.S. PATENT DOCUMENTS 6,021,947 A * 2/2000 Swartz ............... G06K 7/10564
235/462.43
2014/0240952 A1* 8/2014 Nakanishi ........... H01S 5/02253
29/25.01

(Continued)

*Primary Examiner* — Jennifer D. Carruth

(57) ABSTRACT

Systems, devices, and methods of manufacturing optical engines and laser projectors that are well-suited for use in wearable heads-up displays (WHUDs) are described. Generally, the optical engines of the present disclosure integrate a plurality of laser diodes (e.g., 3 laser diodes, 4 laser diodes) within a single, hermetically or partially hermetically sealed, encapsulated package. Such optical engines may have various advantages over existing designs including, for example, smaller volumes, better manufacturability, faster modulation speed, etc. WHUDs that employ such optical engines and laser projectors are also described.

19 Claims, 11 Drawing Sheets

Related U.S. Application Data

(60) Provisional application No. 62/760,835, filed on Nov. 13, 2018, provisional application No. 62/620,600, filed on Jan. 23, 2018, provisional application No. 62/609,870, filed on Dec. 22, 2017, provisional application No. 62/608,749, filed on Dec. 21, 2017, provisional application No. 62/597,294, filed on Dec. 11, 2017, provisional application No. 62/591,550, filed on Nov. 28, 2017, provisional application No. 62/591,030, filed on Nov. 27, 2017.

(51) Int. Cl.

| | |
|---|---|
| *H01S 5/02224* | (2021.01) |
| *H01S 5/02253* | (2021.01) |
| *H01S 5/02255* | (2021.01) |
| *H01S 5/02257* | (2021.01) |
| *H01S 5/0237* | (2021.01) |
| *H01S 5/40* | (2006.01) |
| *H01S 5/00* | (2006.01) |
| *H01S 5/02216* | (2021.01) |
| *H01S 5/02325* | (2021.01) |
| *H01S 5/042* | (2006.01) |

(52) U.S. Cl.
CPC ...... *H01S 5/02224* (2013.01); *H01S 5/02253* (2021.01); *H01S 5/02255* (2021.01); *H01S 5/02257* (2021.01); *H01S 5/0237* (2021.01); *H01S 5/4093* (2013.01); *G02B 2027/015* (2013.01); *G02B 2027/0178* (2013.01); *H01S 5/0071* (2013.01); *H01S 5/02216* (2013.01); *H01S 5/02325* (2021.01); *H01S 5/042* (2013.01); *H01S 5/4012* (2013.01); *H01S 5/4087* (2013.01)

(58) Field of Classification Search
CPC .... H01S 5/0237; H01S 5/4093; H01S 5/0071; H01S 5/02216; H01S 5/02325; H01S 5/042; H01S 5/4012; H01S 5/4087
See application file for complete search history.

(56) References Cited

U.S. PATENT DOCUMENTS

| | | | | |
|---|---|---|---|---|
| 2015/0090864 A1* | 4/2015 | Flens | ..................... | H04B 10/40 |
| | | | | 250/208.2 |
| 2016/0349514 A1* | 12/2016 | Alexander | ......... | G02B 26/0833 |
| 2019/0121133 A1* | 4/2019 | Pierer | .................. | H04N 9/3129 |
| 2019/0121137 A1* | 4/2019 | Dykaar | .............. | H01S 5/02325 |
| 2019/0121138 A1* | 4/2019 | Dykaar | .................. | G02B 27/30 |
| 2019/0121139 A1* | 4/2019 | Dykaar | .............. | H01S 5/02257 |
| 2019/0199058 A1* | 6/2019 | Pierer | .................. | H01S 5/0236 |

* cited by examiner

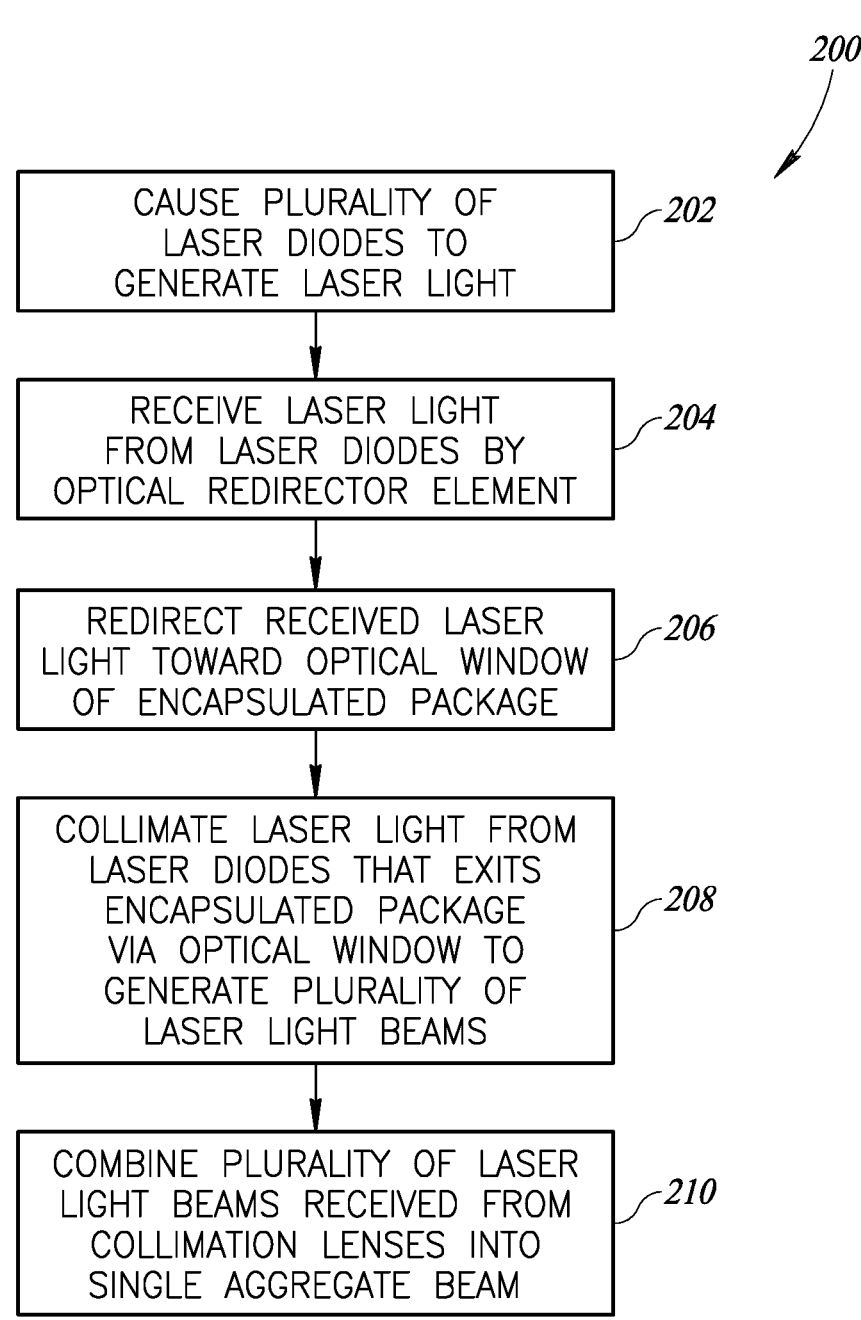

*200*

CAUSE PLURALITY OF
LASER DIODES TO
GENERATE LASER LIGHT ⟋*202*

RECEIVE LASER LIGHT
FROM LASER DIODES BY
OPTICAL REDIRECTOR ELEMENT ⟋*204*

REDIRECT RECEIVED LASER
LIGHT TOWARD OPTICAL WINDOW
OF ENCAPSULATED PACKAGE ⟋*206*

COLLIMATE LASER LIGHT FROM
LASER DIODES THAT EXITS
ENCAPSULATED PACKAGE
VIA OPTICAL WINDOW TO
GENERATE PLURALITY OF
LASER LIGHT BEAMS ⟋*208*

COMBINE PLURALITY OF LASER
LIGHT BEAMS RECEIVED FROM
COLLIMATION LENSES INTO
SINGLE AGGREGATE BEAM ⟋*210*

BOND LASER DIODES
TO SUBMOUNTS                          *502*

BOND LASER CHIP ON
SUBMOUNT TO BASE
SUBSTRATE                             *504*

BOND OPTICAL DIRECTOR
ELEMENT TO BASE
SUBSTRATE                             *506*

BOND LASER DIODE
DRIVER CIRCUIT TO
BASE SUBSTRATE                        *508*

BOND CAP TO BASE
SUBSTRATE TO FORM
HERMETIC SEAL                         *510*

ACTIVELY ALIGN
COLLIMATION LENSES                    *512*

POSITION BEAM COMBINER
TO RECEIVE AND COMBINE
INDIVIDUAL LASER BEAMS
INTO AGGREGATE BEAM                   *514*

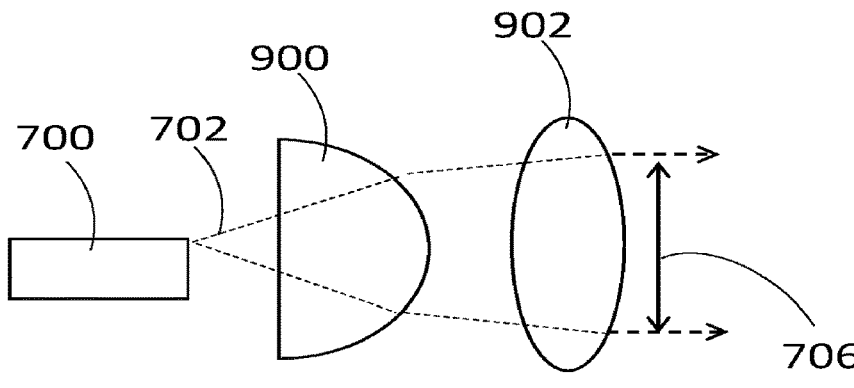
FIG. 9A
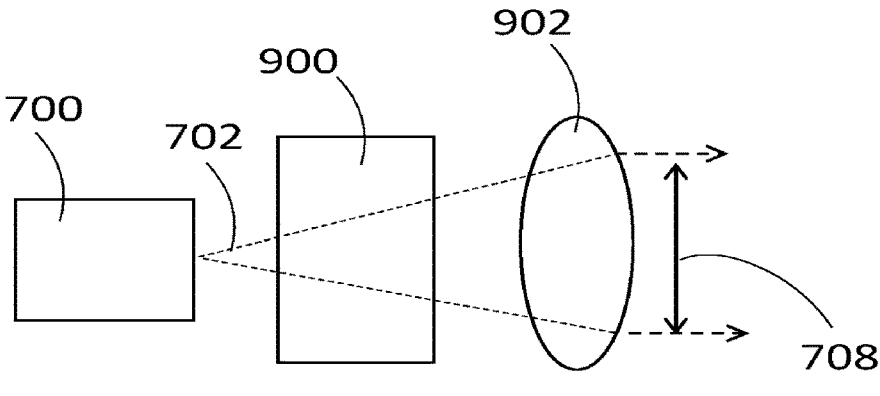
FIG. 9B
FIG. 9C                                        FIG. 9D

COMPACT OPTICAL ENGINE AND METHOD OF MANUFACTURING SAME

CROSS-REFERENCE TO RELATED APPLICATIONS

The present application claims priority to and is a continuation of U.S. patent application Ser. No. 16/201,770, entitled "Compact optical engine and method of manufacturing same" and filed on Nov. 27, 2018, which claims priority to U.S. Provisional Patent Application Ser. No. 62/760, 835, filed on Nov. 13, 2018, entitled "PHOTONIC INTEGRATED CIRCUIT FABRICATED BY DIRECT LASER WRITING," U.S. Provisional Patent Application Ser. No. 62/620,600, filed on Jan. 23, 2018, entitled "WAVELENGTH STABILIZATION OF LASER DIODES BY TEMPERATURE CONTROL," U.S. Provisional Patent Application Ser. No. 62/609,870, filed on Dec. 22, 2017, entitled "GRATING WAVEGUIDE COMBINER FOR OPTICAL ENGINE," U.S. Provisional Patent Application Ser. No. 62/608,749, filed on Dec. 21, 2017, entitled "DIRECTLY WRITTEN WAVEGUIDE FOR COUPLING OF LASER TO PHOTONIC INTEGRATED CIRCUIT," U.S. Provisional Patent Application Ser. No. 62/597,294, filed on Dec. 11, 2017, entitled "WAVELENGTH COMBINER PHOTONIC INTEGRATED CIRCUIT WITH GRATING COUPLING OF LASERS," U.S. Provisional Patent Application Ser. No. 62/591,550, filed on Nov. 28, 2017, entitled "WAVELENGTH COMBINER PHOTONIC INTEGRATED CIRCUIT WITH EDGE COUPLING OF LASERS," and U.S. Provisional Patent Application Ser. No. 62/591,030, filed on Nov. 27, 2017, entitled "COMPACT OPTICAL ENGINE AND METHOD OF MANUFACTURING SAME," each of which is incorporated by reference herein in its entirety.

BACKGROUND

Technical Field

The present disclosure is generally directed to systems, devices, and methods relating to optical engines, for example, optical engines for laser projectors used in wearable heads-up displays or other applications.

Description of the Related Art

A projector is an optical device that projects or shines a pattern of light onto another object (e.g., onto a surface of another object, such as onto a projection screen) in order to display an image or video on that other object. A projector necessarily includes a light source, and a laser projector is a projector for which the light source comprises at least one laser. The at least one laser is temporally modulated to provide a pattern of laser light and usually at least one controllable mirror is used to spatially distribute the modulated pattern of laser light over a two-dimensional area of another object. The spatial distribution of the modulated pattern of laser light produces an image at or on the other object. In conventional scanning laser projectors, at least one controllable mirror may be used to control the spatial distribution, and may include: a single digital micromirror (e.g., a microelectromechanical system ("MEMS") based digital micromirror) that is controllably rotatable or deformable in two dimensions, or two digital micromirrors that are each controllably rotatable or deformable about a respective dimension, or a digital light processing ("DLP") chip comprising an array of digital micromirrors.

In a conventional laser projector comprising an RGB (red/green/blue) laser module with a red laser diode, a green laser diode, and a blue laser diode, each respective laser diode may have a corresponding respective focusing lens. Each of the laser diodes of a laser module are typically housed in a separate package (e.g., a TO-38 package or "can"). The relative positions of the laser diodes, the focusing lenses, and the at least one controllable mirror are all tuned and aligned so that each laser beam impinges on the at least one controllable mirror with substantially the same spot size and with substantially the same rate of convergence (so that all laser beams will continue to have substantially the same spot size as they propagate away from the laser projector towards, e.g., a projection screen). In a conventional laser projector, it is usually possible to come up with such a configuration for all these elements because the overall form factor of the device is not a primary design consideration. However, in applications for which the form factor of the laser projector is an important design element, it can be very challenging to find a configuration for the laser diodes, the focusing lenses, and the at least one controllable mirror that sufficiently aligns the laser beams (at least in terms of spot size, spot position, and rate of convergence) while satisfying the form factor constraints.

A head-mounted display is an electronic device that is worn on a user's head and, when so worn, secures at least one electronic display within a viewable field of at least one of the user's eyes, regardless of the position or orientation of the user's head. A wearable heads-up display is a head-mounted display that enables the user to see displayed content but also does not prevent the user from being able to see their external environment. The "display" component of a wearable heads-up display is either transparent or at a periphery of the user's field of view so that it does not completely block the user from being able to see their external environment. A "combiner" component of a wearable heads-up display is the physical structure where display light and environmental light merge as one within the user's field of view. The combiner of a wearable heads-up display is typically transparent to environmental light but includes some optical routing mechanism to direct display light into the user's field of view.

Examples of wearable heads-up displays include: the Google Glass®, the Optinvent Ora®, the Epson Moverio®, and the Sony Glasstron®, just to name a few.

The optical performance of a wearable heads-up display is an important factor in its design. When it comes to face-worn devices, users also care a lot about aesthetics and comfort. This is clearly highlighted by the immensity of the eyeglass (including sunglass) frame industry. Independent of their performance limitations, many of the aforementioned examples of wearable heads-up displays have struggled to find traction in consumer markets because, at least in part, they lack fashion appeal or comfort. Most wearable heads-up displays presented to date employ relatively large components and, as a result, are considerably bulkier, less comfortable and less stylish than conventional eyeglass frames.

BRIEF SUMMARY

A method of manufacturing an optical engine may be summarized as including: bonding a plurality of chip submounts to a base substrate, each of the chip submounts including a laser diode bonded thereto; and bonding a cap comprising at least one wall and at least one optical window to the base substrate, the at least one wall, the at least one optical window, and at least a portion of the base substrate together delimit an interior volume sized and dimensioned to receive at least the plurality of chip submounts and laser diodes bonded to the plurality of chip submounts, the bonding of the cap to the base substrate providing a hermetic or partially hermetic seal between the interior volume of the cap and a volume exterior to the cap, and the optical window positioned and oriented to allow light emitted from the laser diodes to exit the interior volume.

The method of manufacturing an optical engine may further include bonding at least one of the laser diodes to a corresponding one of the plurality of chip submounts.

Bonding at least one of the laser diodes to a corresponding one of the plurality of chip submounts may include bonding at least one of the laser diodes to a corresponding one of the plurality of chip submounts using a eutectic gold tin (AuSn) solder process.

The method of manufacturing an optical engine may further include: positioning a plurality of collimation lenses to be adjacent the at least one optical window, each of the plurality of collimation lenses positioned and oriented to receive light from a corresponding one of the laser diodes through the at least one optical window; and actively aligning each of the plurality of collimation lenses.

The method of manufacturing an optical engine may further include subsequent to actively aligning each of the plurality of collimation lenses, bonding each of the collimation lenses to the at least one optical window.

Actively aligning each of the plurality of collimation lenses may include positioning each of the collimation lenses to optimize spot and pointing for each of the respective laser diodes.

The method of manufacturing an optical engine may further include positioning a beam combiner to combine light beams received from each of the collimation lenses into a single aggregate beam.

The method of manufacturing an optical engine may further include, prior to bonding the cap to the base substrate, bonding an optical director element to the base substrate proximate the laser diodes, the optical director element positioned and oriented to direct laser light from the laser diodes toward the optical window of the cap.

Bonding an optical director element may include bonding one of a mirror or prism to the base substrate proximate the laser diodes. Bonding an optical director element may include bonding an optical director element to a base substrate using at least one of a reflow oven process, thermosonic bonding, thermocompression bonding, transient liquid phase (TLP) bonding, or laser soldering.

The method of manufacturing an optical engine may further include providing a coupling between at least one laser diode driver circuit and the laser diodes, in operation the at least one laser diode driver circuit selectively driving current to the laser diodes.

The method of manufacturing an optical engine may further include: bonding at least one laser diode driver circuit to the base substrate; and providing a coupling between the at least one laser diode driver circuit and the laser diodes, in operation the at least one laser diode driver circuit selectively driving current to the laser diodes.

Bonding the at least one laser diode driver circuit to the base substrate may include bonding the at least one laser diode driver circuit to a first surface of the base substrate, and bonding the cap to the base substrate may include bonding the cap to a second surface of the base substrate, the second surface of the base substrate opposite the first surface of the base substrate. Bonding the at least one laser diode driver circuit to the base substrate may include bonding the at least one laser diode driver circuit to a first surface of the base substrate, and bonding the cap to the base substrate may include bonding the cap to the first surface of the base substrate.

The method of manufacturing an optical engine may further include providing the base substrate, wherein the base substrate is formed from one of low temperature co-fired ceramic or alumina.

Bonding a plurality of chip submounts to a base substrate may include step-soldering a plurality of chip submounts to a base substrate. Bonding a plurality of chip submounts to a base substrate may include bonding a plurality of chip submounts to a base substrate using at least one of a reflow oven process, thermosonic bonding, thermocompression bonding, transient liquid phase (TLP) bonding, or laser soldering. Bonding a cap to the base substrate may include bonding a cap to the base substrate using at least one of a seam welding process, a laser assisted soldering process, or a diffusion bonding process.

The method of manufacturing an optical engine may further include, prior to bonding the cap to the base substrate, flooding the interior volume with an oxygen rich atmosphere.

Bonding a plurality of chip submounts to a base substrate may include bonding a chip submount that has a red laser diode bonded thereto, bonding a chip submount that has a green laser diode bonded thereto, bonding a chip submount that has a blue laser diode bonded thereto, and bonding a chip submount that has an infrared laser diode bonded thereto. Bonding a plurality of chip submounts to a base substrate may include soldering a plurality of chip submounts to a base substrate using a reactive multi-layer foil material preform.

A method of manufacturing an optical engine may be summarized as including: bonding a plurality of laser diodes directly or indirectly to a base substrate; and bonding a cap comprising at least one wall and at least one optical window to the base substrate, the at least one wall, the at least one optical window, and at least a portion of the base substrate together delimit an interior volume sized and dimensioned to receive at least the plurality of laser diodes bonded to the base substrate, the bonding of the cap to the base substrate providing a hermetic or partially hermetic seal between the interior volume of the cap and a volume exterior to the cap, and the optical window positioned and oriented to allow light emitted from the laser diodes to exit the interior volume.

The method of manufacturing an optical engine may further include bonding at least one of the laser diodes indirectly to the base substrate by bonding the at least one laser diode to a respective chip submount; and bonding the chip submount to the base substrate.

The method of manufacturing an optical engine may further include bonding each of the laser diodes indirectly to the base substrate by bonding each laser diode to a respective chip submount; and bonding each chip submount to the base substrate. Bonding each laser diode to a respective chip submount may include bonding each laser diode to a respective chip submount using a eutectic gold tin (AuSn) solder process. Bonding each chip submount to the base substrate may include step-soldering each chip submount to the base substrate. Bonding each chip submount to the base substrate may include bonding each chip submount to the base substrate using at least one of a reflow oven process, thermosonic bonding, thermocompression bonding, transient liquid phase (TLP) bonding, or laser soldering. Bonding each chip submount to the base substrate may include bonding a chip submount that has a red laser diode bonded thereto, bonding a chip submount that has a green laser diode bonded thereto, bonding a chip submount that has a blue laser diode bonded thereto, and bonding a chip submount that has an infrared laser diode bonded thereto. Bonding each chip submount to the base substrate may include soldering each chip submount to the base substrate using a reactive multi-layer foil material preform.

The method of manufacturing an optical engine may further include positioning a plurality of collimation lenses to be adjacent the at least one optical window, each of the plurality of collimation lenses positioned and oriented to receive light from a corresponding one of the laser diodes through the at least one optical window; and actively aligning each of the plurality of collimation lenses. The method of manufacturing an optical engine may further include, subsequent to actively aligning each of the plurality of collimation lenses, bonding each of the collimation lenses to the at least one optical window. Actively aligning each of the plurality of collimation lenses may include positioning each of the collimation lenses to optimize spot and pointing for each of the respective laser diodes. The method of manufacturing an optical engine may further include positioning a beam combiner to combine light beams received from each of the collimation lenses into a single aggregate beam.

The method of manufacturing an optical engine may further include, prior to bonding the cap to the base substrate, bonding an optical director element to the base substrate proximate the laser diodes, the optical director element positioned and oriented to direct laser light from the laser diodes toward the optical window of the cap. Bonding an optical director element may include bonding one of a mirror or prism to the base substrate proximate the laser diodes. Bonding an optical director element may include bonding an optical director element to a base substrate using at least one of a reflow oven process, thermosonic bonding, thermocompression bonding, transient liquid phase (TLP) bonding, or laser soldering.

The method of manufacturing an optical engine may further include providing a coupling between at least one laser diode driver circuit and the laser diodes, in operation the at least one laser diode driver circuit selectively driving current to the laser diodes.

The method of manufacturing an optical engine may further include: bonding at least one laser diode driver circuit to the base substrate; and providing a coupling between the at least one laser diode driver circuit and the laser diodes, in operation the at least one laser diode driver circuit selectively driving current to the laser diodes.

The method of manufacturing an optical engine may further include providing the base substrate, wherein the base substrate is formed from one of low temperature co-fired ceramic, aluminum nitride (AlN), Kovar®, or alumina.

Bonding a cap to the base substrate may include bonding a cap to the base substrate using at least one of a seam welding process, a laser assisted soldering process, or a diffusion bonding process.

The method of manufacturing an optical engine may further include, prior to bonding the cap to the base substrate, flooding the interior volume with an oxygen rich atmosphere.

A method of manufacturing a laser projector may be summarized as including: bonding a plurality of laser diodes directly or indirectly to a first base substrate; providing a coupling between at least one laser diode driver circuit and the laser diodes, in operation the at least one laser diode driver circuit selectively drives current to the laser diodes; bonding a cap comprising at least one wall and at least one optical window to the first base substrate, the at least one wall, the at least one optical window, and at least a portion of the first base substrate together delimit an interior volume sized and dimensioned to receive at least the plurality of laser diodes bonded to the first base substrate, the bonding of the cap to the first base substrate providing a hermetic or partially hermetic seal between the interior volume of the cap and a volume exterior to the cap, and the optical window positioned and oriented to allow light emitted from the laser diodes to exit the interior volume; bonding a plurality of collimation lenses to be adjacent the at least one optical window, each of the plurality of collimation lenses positioned and oriented to receive light from a corresponding one of the laser diodes through the at least one optical window; positioning a beam combiner to combine light beams received from each of the collimation lenses into a single aggregate beam; and positioning at least one scan mirror to receive laser light from the plurality of laser diodes, the at least one scan mirror controllably orientable to redirect the laser light over a range of angles.

The method of manufacturing a laser projector may further include bonding at least one of the laser diodes indirectly to the first base substrate by bonding the at least one laser diode to a respective chip submount; and bonding the chip submount to the first base substrate.

The method of manufacturing a laser projector may further include bonding each of the laser diodes indirectly to the first base substrate by bonding each laser diode to a respective chip submount; and bonding each chip submount to the first base substrate. Bonding each laser diode to a respective chip submount may include bonding each laser diode to a respective chip submount using a eutectic gold tin (AuSn) solder process. Bonding each chip submount to the first base substrate may include step-soldering each chip submount to the first base substrate. Bonding each chip submount to the first base substrate may include bonding each chip submount to the first base substrate using at least one of a reflow oven process, thermosonic bonding, thermocompression bonding, transient liquid phase (TLP) bonding, or laser soldering. Bonding each chip submount to the first base substrate may include bonding a chip submount that has a red laser diode bonded thereto, bonding a chip submount that has a green laser diode bonded thereto, bonding a chip submount that has a blue laser diode bonded thereto, and bonding a chip submount that has an infrared laser diode bonded thereto. Bonding each chip submount to the first base substrate may include soldering each chip submount to the first base substrate using a reactive multilayer foil material preform.

The method of manufacturing a laser projector may further include, prior to bonding the plurality of collimation lenses, actively aligning each of the plurality of collimation lenses. Actively aligning each of the plurality of collimation lenses may include positioning each of the collimation lenses to optimize spot and pointing for each of the respective laser diodes.

The method of manufacturing a laser projector may further include, prior to bonding the cap to the first base substrate, bonding an optical director element to the first base substrate proximate the laser diodes, the optical director element positioned and oriented to direct laser light from the laser diodes toward the optical window of the cap. Bonding an optical director element may include bonding one of a mirror or prism to the first base substrate proximate the laser diodes. Bonding an optical director element may include bonding an optical director element to a first base substrate using at least one of a reflow oven process, thermosonic bonding, thermocompression bonding, transient liquid phase (TLP) bonding, or laser soldering.

The method of manufacturing a laser projector may further include bonding the at least one laser diode driver circuit to the first base substrate.

The method of manufacturing a laser projector may further include providing the first base substrate, wherein the first base substrate is formed from one of low temperature co-fired ceramic, aluminum nitride (AlN), Kovar®, or alumina.

Bonding a cap to the first base substrate may include bonding a cap to the first base substrate using at least one of a seam welding process, a laser assisted soldering process, or a diffusion bonding process.

The method of manufacturing a laser projector may further include, prior to bonding the cap to the first base substrate, flooding the interior volume with an oxygen rich atmosphere.

The method of manufacturing a laser projector may further include bonding a plurality of electrical connections to the first base substrate, each electrical connection coupled to a respective laser diode in the plurality of laser diodes; bonding an electrically insulating cover to the first base substrate over the plurality of electrical connections; and providing a coupling between the at least one laser diode driver circuit and the plurality of electrical connections, in operation the at least one laser diode driver circuit selectively drives current to the laser diodes via the plurality of electrical connections.

The method of manufacturing a laser projector may further include bonding the at least one laser diode driver circuit to a first surface of the first base substrate, bonding the plurality of electrical connections to the first base substrate may include bonding the plurality of electrical connections to the first surface of the first base substrate; and bonding the electrically insulating cover to the first base substrate may include bonding the electrically insulating cover to the first surface of the first base substrate over the plurality of electrical connections; and bonding the cap to the first base substrate may include bonding the cap to the first surface of the base substrate and bonding the cap to the electrically insulating cover.

Bonding the plurality of electrical connections to the first base substrate may include bonding the plurality of electrical connections to the first surface of the first base substrate; bonding the electrically insulating cover to the first base substrate may include bonding the electrically insulating cover to the first surface of the first base substrate over the plurality of electrical connections; and bonding the cap to the first base substrate may include bonding the cap to the first surface of the base substrate and bonding the cap to the electrically insulating cover, and the method of manufacturing a laser projector may further include bonding a plurality of electrical contacts to the first base substrate, each electrical contact coupled to a respective one of the plurality of electrical connections; and providing a coupling between the at least one laser diode driver circuit and the plurality of electrical contacts, in operation the at least one laser diode driver circuit selectively drives current to the laser diodes via the plurality of electrical contacts and the plurality of electrical connections.

A method of manufacturing a wearable heads-up display (WHUD) may be summarized as including: providing a support structure that in use is worn on the head of a user; manufacturing a laser projector by: bonding a plurality of laser diodes directly or indirectly to a first base substrate; providing a coupling between at least one laser diode driver circuit and the laser diodes, in operation the at least one laser diode driver circuit selectively drives current to the laser diodes; bonding a cap comprising at least one wall and at least one optical window to the first base substrate, the at least one wall, the at least one optical window, and at least a portion of the first base substrate together delimit an interior volume sized and dimensioned to receive at least the plurality of laser diodes bonded to the first base substrate, the bonding of the cap to the first base substrate providing a hermetic or partially hermetic seal between the interior volume of the cap and a volume exterior to the cap, and the optical window positioned and oriented to allow light emitted from the laser diodes to exit the interior volume; bonding a plurality of collimation lenses to be adjacent the at least one optical window, each of the plurality of collimation lenses positioned and oriented to receive light from a corresponding one of the laser diodes through the at least one optical window; positioning a beam combiner to combine light beams received from each of the collimation lenses into a single aggregate beam; and positioning at least one scan mirror to receive laser light from the plurality of laser diodes, the at least one scan mirror controllably orientable to redirect the laser light over a range of angles; and coupling the laser projector to the support structure.

The method of manufacturing a WHUD may further include bonding at least one of the laser diodes indirectly to the first base substrate by bonding the at least one laser diode to a respective chip submount; and bonding the chip submount to the first base substrate.

The method of manufacturing a WHUD may further include bonding each of the laser diodes indirectly to the first base substrate by bonding each laser diode to a respective chip submount; and bonding each chip submount to the first base substrate. Bonding each laser diode to a respective chip submount may include bonding each laser diode to a respective chip submount using a eutectic gold tin (AuSn) solder process. Bonding each chip submount to the first base substrate may include step-soldering each chip submount to the first base substrate. Bonding each chip submount to the first base substrate may include bonding each chip submount to the first base substrate using at least one of a reflow oven process, thermosonic bonding, thermocompression bonding, transient liquid phase (TLP) bonding, or laser soldering. Bonding each chip submount to the first base substrate may include bonding a chip submount that has a red laser diode bonded thereto, bonding a chip submount that has a green laser diode bonded thereto, bonding a chip submount that has a blue laser diode bonded thereto, and bonding a chip submount that has an infrared laser diode bonded thereto. Bonding each chip submount to the first base substrate may include soldering each chip submount to the first base substrate using a reactive multi-layer foil material preform.

The method of manufacturing a WHUD may further include, prior to bonding the plurality of collimation lenses, actively aligning each of the plurality of collimation lenses. Actively aligning each of the plurality of collimation lenses may include positioning each of the collimation lenses to optimize spot and pointing for each of the respective laser diodes.

The method of manufacturing a WHUD may further include, prior to bonding the cap to the first base substrate, bonding an optical director element to the first base substrate proximate the laser diodes, the optical director element positioned and oriented to direct laser light from the laser diodes toward the optical window of the cap. Bonding an optical director element may include bonding one of a mirror or prism to the first base substrate proximate the laser diodes. Bonding an optical director element may include bonding an optical director element to a first base substrate using at least one of a reflow oven process, thermosonic bonding, thermocompression bonding, transient liquid phase (TLP) bonding, or laser soldering.

The method of manufacturing a WHUD may further include providing the first base substrate, wherein the first base substrate is formed from one of low temperature co-fired ceramic, aluminum nitride (AlN), Kovar®, or alumina.

Bonding a cap to the first base substrate may include bonding a cap to the first base substrate using at least one of a seam welding process, a laser assisted soldering process, or a diffusion bonding process.

The method of manufacturing a WHUD may further include, prior to bonding the cap to the first base substrate, flooding the interior volume with an oxygen rich atmosphere.

The method of manufacturing a WHUD may further include bonding a plurality of electrical connections to the first base substrate, each electrical connection coupled to a respective laser diode in the plurality of laser diodes; bonding an electrically insulating cover to the first base substrate over the plurality of electrical connections; and providing a coupling between the at least one laser diode driver circuit and the plurality of electrical connections, in operation the at least one laser diode driver circuit selectively drives current to the laser diodes via the plurality of electrical connections.

The method of manufacturing a WHUD may further include bonding the at least one laser diode driver circuit to a first surface of the first base substrate, and bonding the plurality of electrical connections to the first base substrate may include bonding the plurality of electrical connections to the first surface of the first base substrate; bonding the electrically insulating cover to the first base substrate may include bonding the electrically insulating cover to the first surface of the first base substrate over the plurality of electrical connections; and bonding the cap to the first base substrate may include bonding the cap to the first surface of the base substrate and bonding the cap to the electrically insulating cover.

Bonding the plurality of electrical connections to the first base substrate may include bonding the plurality of electrical connections to the first surface of the first base substrate; bonding the electrically insulating cover to the first base substrate may include bonding the electrically insulating cover to the first surface of the first base substrate over the plurality of electrical connections; and bonding the cap to the first base substrate may include bonding the cap to the first surface of the base substrate and bonding the cap to the electrically insulating cover, and the method of manufacturing a WHUD may further include bonding a plurality of electrical contacts to the first base substrate, each electrical contact coupled to a respective one of the plurality of electrical connections; and providing a coupling between the at least one laser diode driver circuit and the plurality of electrical contacts, in operation the at least one laser diode driver circuit selectively drives current to the laser diodes via the plurality of electrical contacts and the plurality of electrical connections.

The method of manufacturing a WHUD may further include bonding the at least one laser diode driver circuit to a second base substrate.

The method of manufacturing a WHUD may further include mounting the at least one laser diode driver circuit to the support structure.

Bonding the cap to the first base substrate may include bonding the cap to a first surface of the first base substrate, and the method of manufacturing a WHUD may further include bonding the at least one laser diode driver circuit to a second surface of the base substrate, the second surface of the base substrate opposite the first surface of the base substrate.

A method of manufacturing an optical engine may be summarized as including: bonding a plurality of laser diodes directly or indirectly to a first base substrate; bonding a plurality of electrical connections to the first base substrate, each electrical connection coupled to a respective laser diode in the plurality of laser diodes; bonding an electrically insulating cover to the first base substrate over the plurality of electrical connections; and bonding a cap comprising at least one wall and at least one optical window to the first base substrate and the electrically insulating cover, wherein the at least one wall, the at least one optical window, the electrically insulating cover, and at least a portion of the first base substrate together delimit an interior volume sized and dimensioned to receive at least the plurality of laser diodes, the bonding of the cap to the first base substrate and the electrically insulating cover providing a hermetic or partially hermetic seal between the interior volume of the cap and a volume exterior to the cap, and the optical window positioned and oriented to allow light emitted from the laser diodes to exit the interior volume.

The method of manufacturing an optical engine may further include bonding at least one of the laser diodes indirectly to the first base substrate by bonding the at least one laser diode to a respective chip submount; and bonding the chip submount to the first base substrate.

The method of manufacturing an optical engine may further include bonding each of the laser diodes indirectly to the first base substrate by bonding each laser diode to a respective chip submount; and bonding each chip submount to the first base substrate. Bonding each laser diode to a respective chip submount may include bonding each laser diode to a respective chip submount using a eutectic gold tin (AuSn) solder process. Bonding each chip submount to the first base substrate may include step-soldering each chip submount to the first base substrate. Bonding each chip submount to the first base substrate may include bonding each chip submount to the first base substrate using at least one of a reflow oven process, thermosonic bonding, thermocompression bonding, transient liquid phase (TLP) bonding, or laser soldering. Bonding each chip submount to the first base substrate comprises bonding a chip submount that has a red laser diode bonded thereto, bonding a chip submount that has a green laser diode bonded thereto, bonding a chip submount that has a blue laser diode bonded thereto, and bonding a chip submount that has an infrared laser diode bonded thereto. Bonding each chip submount to the first base substrate comprises soldering each chip submount to the first base substrate using a reactive multi-layer foil material preform.

The method of manufacturing an optical engine may further include positioning a plurality of collimation lenses to be adjacent the at least one optical window, each of the plurality of collimation lenses positioned and oriented to receive light from a corresponding one of the laser diodes through the at least one optical window; and actively aligning each of the plurality of collimation lenses. The method of manufacturing an optical engine may further include, subsequent to actively aligning each of the plurality of collimation lenses, bonding each of the collimation lenses to the at least one optical window. Actively aligning each of the plurality of collimation lenses may include positioning each of the collimation lenses to optimize spot and pointing for each of the respective laser diodes. The method of manufacturing an optical engine may further include positioning a beam combiner to combine light beams received from each of the collimation lenses into a single aggregate beam.

The method of manufacturing an optical engine may further include, prior to bonding the cap to the first base substrate and electrically insulating cover, bonding an optical director element to the first base substrate proximate the laser diodes, the optical director element positioned and oriented to direct laser light from the laser diodes toward the optical window of the cap. Bonding an optical director element may include bonding one of a mirror or prism to the first base substrate proximate the laser diodes. Bonding an optical director element may include bonding an optical director element to a first base substrate using at least one of a reflow oven process, thermosonic bonding, thermocompression bonding, transient liquid phase (TLP) bonding, or laser soldering.

The method of manufacturing an optical engine may further include providing a coupling between at least one laser diode driver circuit and the plurality of electrical connections, in operation the at least one laser diode driver circuit selectively drives current to the laser diodes via the plurality of electrical connections.

The method of manufacturing an optical engine may further include bonding at least one laser diode driver circuit to the first base substrate; and providing a coupling between the at least one laser diode driver circuit and the plurality of electrical connections, in operation the at least one laser diode driver circuit selectively drives current to the laser diodes via the plurality of electrical connections.

Bonding the at least one laser diode driver circuit to the first base substrate may include bonding the at least one laser diode driver circuit to a first surface of the first base substrate; bonding the plurality of electrical connections to the first base substrate may include bonding the plurality of electrical connections to the first surface of the first base substrate; bonding the electrically insulating cover to the first base substrate may include bonding the electrically insulating cover to the first surface of the first base substrate over the plurality of electrical connections; and bonding the cap to the first base substrate and the electrically insulating cover may include bonding the cap to the first surface of the base substrate and the electrically insulating cover.

The method of manufacturing an optical engine may further include bonding a plurality of electrical contacts to the first base substrate, each electrical contact coupled to a respective one of the plurality of electrical connections. The method of manufacturing an optical engine may further include bonding at least one laser diode driver circuit to a second base substrate; and providing a coupling between the at least one laser diode driver circuit and the plurality of electrical contacts, in operation the at least one laser diode driver circuit selectively drives current to the laser diodes via the plurality of electrical contacts and the plurality of electrical connections.

The method of manufacturing an optical engine may further include providing the first base substrate, wherein the first base substrate is formed from one of low temperature co-fired ceramic, aluminum nitride (AlN), Kovar®, or alumina.

Bonding a cap to the first base substrate and the electrically insulating cover may include bonding a cap to the first base substrate using at least one of a seam welding process, a laser assisted soldering process, or a diffusion bonding process.

The method of manufacturing an optical engine may further include, prior to bonding the cap to the first base substrate and the electrically insulating cover, flooding the interior volume with an oxygen rich atmosphere.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 2 is a flow diagram of a method of operating an optical engine, in accordance with the present systems, devices, and methods.

FIG. 9A is a side sectional view of a set of collimation lenses for circularizing and collimating a beam of light.

FIG. 9B is a top sectional elevational view of the set of collimation lenses of FIG. 9A.

FIGS. 9C and 9D are isometric views of exemplary lens shapes which could be used as a collimation lens in the implementation of FIGS. 9A and 9B.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure provide laser-based optical engines, for example, laser-based optical engines for laser projectors used in wearable heads-up displays or other applications. Generally, the optical engines discussed herein integrate a plurality of laser dies or diodes (e.g., 3 laser diodes, 4 laser diodes) within a single, hermetically or partially hermetically sealed, encapsulated package. Such optical engines may have various advantages over existing designs including, for example, smaller volume, lower weight, better manufacturability, lower cost, faster modulation speed, etc. The material used for the optical engines discussed herein may be any suitable materials, e.g., ceramics with advantageous thermal properties, etc. As noted above, such features are particularly advantages in various applications including WHUDs.

Figure 1A:
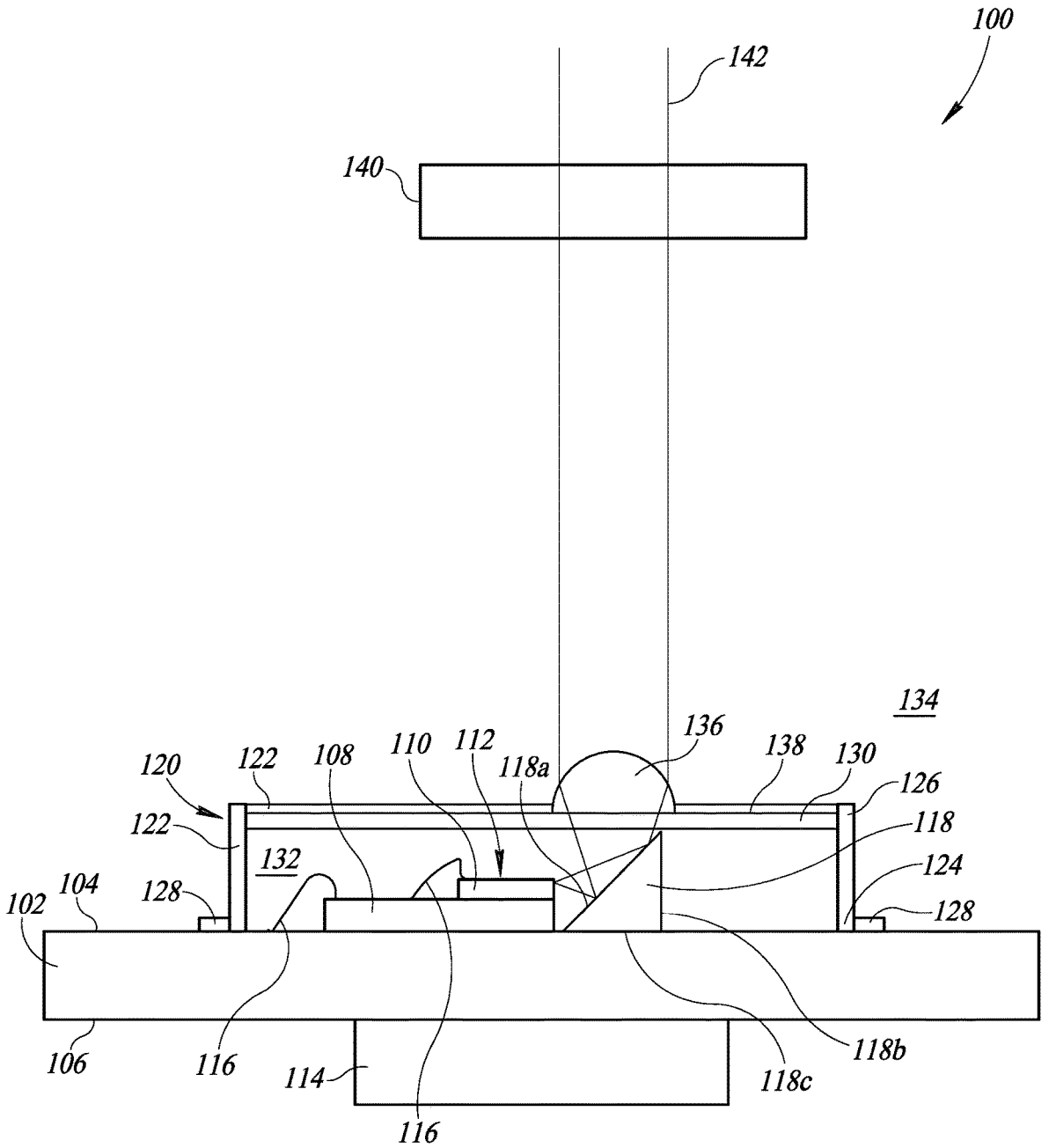
FIG. 1A is a left side, sectional elevational view of an optical engine, in accordance with the present systems, devices, and methods.
Figure 1B:
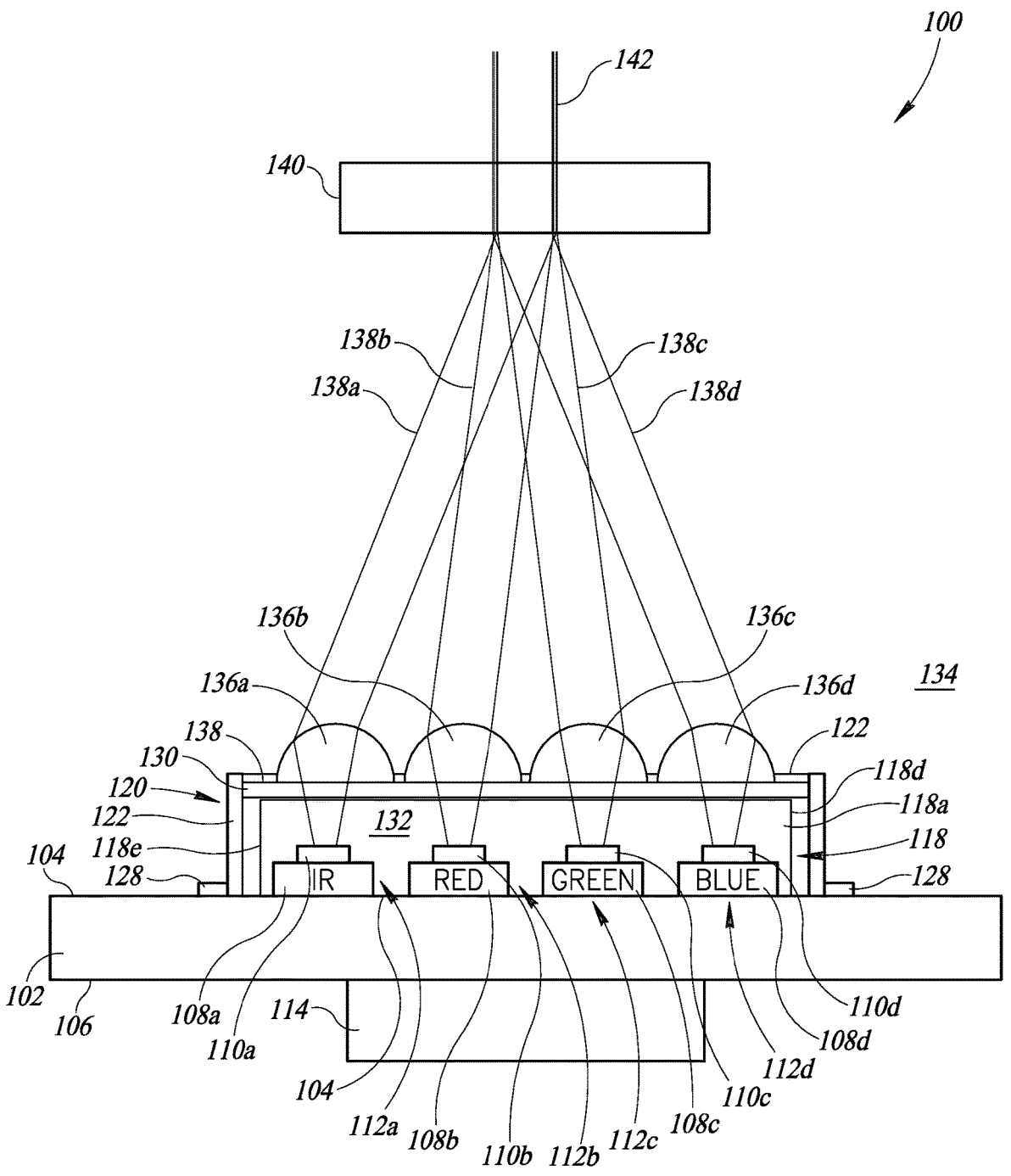
FIG. 1B is a front side, sectional elevational view of the optical engine also shown in FIG. 1A, in accordance with the present systems, devices, and methods.

FIG. 1A is a left side, elevational sectional view of an optical engine 100, which may also be referred to as a "multi-laser diode module" or an "RGB laser module," in accordance with the present systems, devices, and methods. FIG. 1B is a front side, elevational sectional view of the optical engine 100. The optical engine 100 includes a base substrate 102 having a top surface 104 and a bottom surface 106 opposite the top surface. The base substrate 102 may be formed from a material that is radio frequency (RF) compatible and is suitable for hermetic sealing. For example, the base substrate 102 may be formed from low temperature co-fired ceramic (LTCC), aluminum nitride (AlN), alumina, Kovar®, other ceramics with suitable thermal properties, etc. The term Kovar® generally refers to iron-nickel-cobalt alloys having similar thermal expansion coefficients to glass and ceramics, thus making Kovar® materials particularly suitable for forming hermetic seals which remain functional in a wide range of temperatures.

The optical engine 100 also includes a plurality of chip submounts 108a-108d (collectively 108) bonded (e.g., attached) to the top surface 104 of the base substrate 102. The plurality of chip submounts 108 are aligned in a row across a width of the optical engine 100 between the left and right sides thereof. Each of the plurality of chip submounts 108 includes a laser diode 110, also referred to as a laser chip or laser die, bonded thereto. In particular, an infrared chip submount 108a carries an infrared laser diode 110a, a red chip submount 108b carries a red laser diode 110b, a green chip submount 108c carries a green laser diode 110c, and a blue chip submount 108d carries a blue laser diode 110d. In operation, the infrared laser diode 110a provides infrared laser light, the red laser diode 110b provides red laser light, the green laser diode 110c provides green laser light, and the blue laser diode 110d provides blue laser light. Each of the laser diodes 110 may comprise one of an edge emitter laser or a vertical-cavity surface-emitting laser (VCSEL), for example. Each of the four laser diode/chip submount pairs may be referred to collectively as a "laser chip on submount," or a laser CoS 112. Thus, the optical engine 100 includes an infrared laser CoS 112a, a red laser CoS 112b, a green laser CoS 112c, and a blue laser CoS 112d. In at least some implementations, one or more of the laser diodes 110 may be bonded directly to the base substrate 102 without use of a submount 108. It should be appreciated that although some implementations discussed herein describe laser diodes as chips or dies on submounts, other dies or types of devices, e.g., p-side down devices, may be used as well.

The optical engine 100 also includes a laser diode driver circuit 114 bonded to the bottom surface 106 of the base substrate 102. The laser diode driver circuit 114 is operatively coupled to the plurality of laser diodes 110 via suitable electrical connections 116 to selectively drive current to the plurality of laser diodes. In at least some implementations, the laser diode driver circuit 114 may be positioned relative to the CoSs 112 to minimize the distance between the laser diode driver circuit 114 and the CoSs 112. Although not shown in FIGS. 1A and 1B, the laser diode driver circuit 114 may be operatively coupleable to a controller (e.g., micro-controller, microprocessor, ASIC) which controls the operation of the laser diode driver circuit 114 to selectively modulate laser light emitted by the laser diodes 110. In at least some implementations, the laser diode driver circuit 114 may be bonded to another portion of the base substrate 102, such as the top surface 104 of the base substrate. In at least some implementations, the laser diode driver circuitry 114 may be remotely located and operatively coupled to the laser diodes 110. In order to not require the use of impedance matched transmission lines, the size scale may be small compared to a wavelength (e.g., lumped element regime), where the electrical characteristics are described by (lumped) elements like resistance, inductance, and capacitance.

Proximate the laser diodes 110 there is positioned an optical director element 118. Like the chip submounts 108, the optical director element 118 is bonded to the top surface 104 of the base substrate 102. In the illustrated example, the optical director element 118 has a triangular prism shape that includes a plurality of planar faces. In particular the optical director element 118 includes an angled front face 118a that extends along the width of the optical engine 100, a rear face 118b, a bottom face 118c that is bonded to the top surface 104 of the base substrate 102, a left face 118d, and a right face 118e opposite the left face. The optical director element 118 may comprise a mirror or a prism, for example.

The optical engine 100 also includes a cap 120 that includes a vertical sidewall 122 having a lower first end 124 and an upper second end 126 opposite the first end. A flange 128 may be disposed around a perimeter of the sidewall 122 adjacent the lower first end 124. Proximate the upper second end 126 of the sidewall 122 there is a horizontal optical window 130 that forms the "top" of the cap 120. The sidewall 122 and the optical window 130 together define an interior volume 132 sized and dimensioned to receive the plurality of chip submounts 108, the plurality of laser diodes 110, and the optical director element 118. The lower first end 124 and the flange 128 of the cap 120 are bonded to the base substrate 102 to provide a hermetic or partially hermetic seal between the interior volume 132 of the cap and a volume 134 exterior to the cap.

As shown best in FIG. 1A, the optical director element 118 is positioned and oriented to direct (e.g., reflect) laser light received from each of the plurality of laser diodes 108 upward (as shown) toward the optical window 130 of the cap 120, wherein the laser light exits the interior volume 132.

The cap 120 may have a round shape, rectangular shape, or other shape. Thus, the vertical sidewall 122 may comprise a continuously curved sidewall, a plurality (e.g., four) of adjacent planar portions, etc. The optical window 130 may comprise an entire top of the cap 120, or may comprise only a portion thereof. In at least some implementations, the optical window 130 may be located on the sidewall 122 rather than positioned as a top of the cap 120, and the laser diodes 110 and/or the optical director element 118 may be positioned and oriented to direct the laser light from the laser diodes toward the optical window on the sidewall 122. In at least some implementations, the cap 120 may include a plurality of optical windows instead of a single optical window.

The optical engine 100 also includes four collimation/pointing lenses 136a-136d (collectively 136), one for each of the four laser diodes 110a-110d, respectively, that are bonded to a top surface 138 of the optical window 130. Each of the plurality of collimation lenses 136 is positioned and oriented to receive light from a corresponding one of the laser diodes 110 through the optical window 130. In particular, the collimation lens 136a receives light from the infrared laser diode 110a via the optical director element 118 and the optical window 130, the collimation lens 136b receives light from the red laser diode 110b via the optical director element and the optical window, the collimation lens 136c receives light from the green laser diode 110c via the optical director element and the optical window, and the collimation lens 136d receives light from the blue laser diode 110d via the optical director element and the optical window.

Each of the collimation lenses 136 is operative to receive laser light from a respective one of the laser diodes 110, and to generate a single color beam. In particular, the collimation lens 136a receives infrared laser light from the infrared laser diode 110a and produces an infrared laser beam 138a, the collimation lens 136b receives red laser light from the red laser diode 110b and produces a red laser beam 138b, the collimation lens 136c receives green laser light from the green laser diode 110c and produces a green laser beam 138c, and the collimation lens 136d receives blue laser light from the blue laser diode 110d and produces a blue laser beam 138d.

Figure 3:
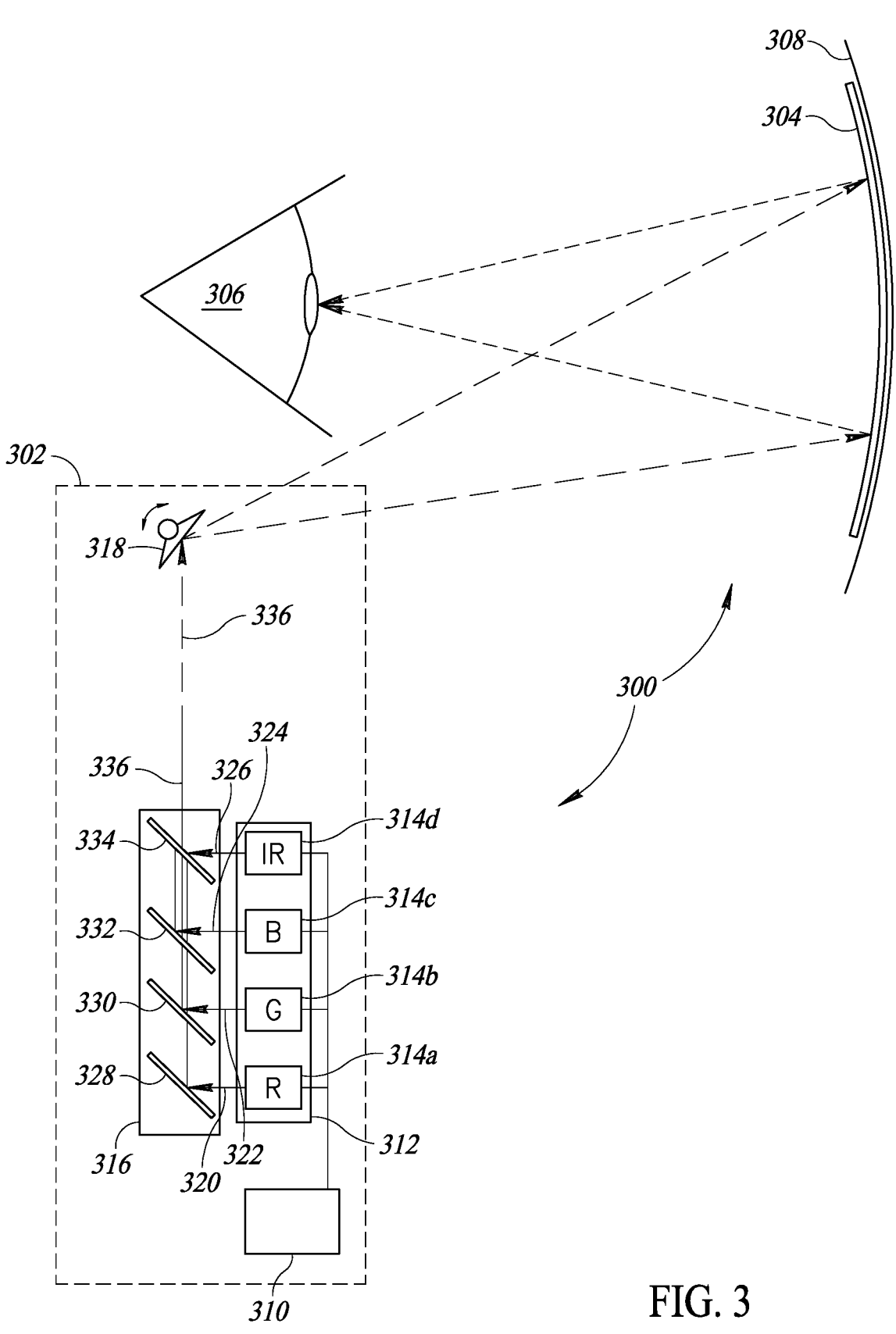
FIG. 3 is a schematic diagram of a wearable heads-up display with a laser projector that includes an optical engine, and a transparent combiner in a field of view of an eye of a user, in accordance with the present systems, devices, and methods.

The optical engine 100 may also include, or may be positioned proximate to, a beam combiner 140 that is positioned and oriented to combine the light beams 138a-138d received from each of the collimation lenses 136 into a single aggregate beam 142. As an example, the beam combiner 140 may include one or more diffractive optical elements (DOE) and/or refractive/reflective optical elements that combine the different color beams 138a-138d in order to achieve coaxial superposition. An example beam combiner is shown in FIG. 3 and discussed below.

In at least some implementations, the laser CoSs 112, the optical director element 118, and/or the collimation lenses 136 may be positioned differently. As noted above, laser diode driver circuit 114 may be mounted on the top surface 104 or the bottom surface 106 of the base substrate 102, depending on the RF design and other constraints (e.g., package size). In at least some implementations, the optical engine 100 may not include the optical director element 118, and the laser light may be directed from the laser diodes 110 toward the collimation lenses 136 without requiring an intermediate optical director element. Additionally, in at least some implementations, one or more of the laser diodes may be mounted directly on the base substrate 102 without use of a submount.

For the sake of a controlled atmosphere inside the interior volume 132, it may be desirable to have no organic compounds inside the interior volume 132. In at least some implementations, the components of the optical engine 100 may be bonded together using no adhesives. In other implementations, a low amount of adhesives may be used to bond at least one of the components, which may reduce cost while providing a relatively low risk of organic contamination for a determined lifetime (e.g., 2 or more years) of the optical engine 100. The use of adhesives may result in a partially hermetic seal, but this partially hermetic seal may be acceptable in certain applications, as detailed below.

Generally, "hermetic" refers to a seal which is airtight, that is, a seal which excludes the passage of air, oxygen, and other gases. "Hermetic" within the present specification carries this meaning. Further, "partially hermetic" as used herein refers to a seal which limits, but does not necessarily completely prevent, the passage of gases such as air. "Partially hermetic" as used herein may alternatively be stated as "reduced hermiticity". In the example above, adhesives may be used to bond components. Such adhesives may result in a seal being not completely hermetic, in that some amount of gasses may slowly leak through the adhesive. However, such a seal can still be considered "partially hermetic" or as having "reduced hermiticity", because the seal reduces the flow of gasses therethrough.

In one example application, even in an environment with only partial hermiticity, the life of laser diodes 110 and transparency of optical window 130 may be maintained longer than the life of a battery of a device, such that partial hermiticity may be acceptable for the devices. In some cases, even protecting interior volume 132 from particulate with a dust cover may be sufficient to maintain laser diodes 110 and transparency of optical window 130 for the intended lifespan of the device. In some cases, laser diodes 110 and transparency of optical window 130 may last for the intended lifespan of the device even without a protective cover. Various bonding processes (e.g., attaching processes) for the optical engine 100 are discussed below with reference to FIG. 5.

FIG. 2 is a flow diagram of a method 200 of operating an optical engine, in accordance with the present systems, devices, and methods. The method 200 may be implemented using the optical engine 100 of FIGS. 1A-1B, for example. It should be appreciated that methods of operating optical engines according to the present disclosure may include fewer or additional acts than set forth in the method 200. Further, the acts discussed below may be performed in an order different than the order presented herein.

At 202, at least one controller may cause a plurality of laser diodes of an optical engine to generate laser light. As discussed above, the plurality of laser diodes may be hermetically or partially hermetically sealed in an encapsulated package. The laser diodes may produce light sequentially and/or simultaneously with each other. At 204, at least one optical director element may receive the laser light from the laser diodes. The optical director element may comprise a mirror or a prism, for example. As discussed above, in at least some implementations the optical engine may be designed such that laser light exits the optical engine without use of an optical director element.

At 206, the at least one optical director element may direct the received laser light toward an optical window of the encapsulated package. For example, the optical director element may reflect the received laser light toward the optical window of the encapsulated package.

At 208, a plurality of collimation lenses may collimate the laser light from the laser diodes that exits the encapsulated package via the optical window to generate a plurality of differently colored laser light beams. The collimation lenses may be positioned inside or outside of the encapsulated package. As an example, the collimation lenses may be physically coupled to the optical window of the encapsulated package.

At 210, a beam combiner may combine the plurality of laser light beams received from each of the collimation lenses into a single aggregate beam. The beam combiner may include one or more diffractive optical elements (DOE) that combine different color beams in order to achieve coaxial superposition, for example. The beam combiner may include one or more DOEs and/or one or more refractive/reflective optical elements. An example beam combiner is shown in FIG. 3 and discussed below.

FIG. 3 is a schematic diagram of a wearable heads-up display (WHUD) 300 with an exemplary laser projector 302, and a transparent combiner 304 in a field of view of an eye 306 of a user of the WHUD, in accordance with the present systems, devices, and methods. The WHUD 300 includes a support structure (not shown), with the general shape and appearance of an eyeglasses frame, carrying an eyeglass lens 308 with the transparent combiner 304, and the laser projector 302.

The laser projector 302 comprises a controller or processor 310, an optical engine 312 comprising four laser diodes 314a, 314b, 314c, 314d (collectively 314) communicatively coupled to the processor 310, a beam combiner 316, and a scan mirror 318. The optical engine 312 may be similar or identical to the optical engine 100 discussed above with reference to FIGS. 1A and 1B. Generally, the term "processor" refers to hardware circuitry, and may include any of microprocessors, microcontrollers, application specific integrated circuits (ASICs), digital signal processors (DSPs), programmable gate arrays (PGAs), and/or programmable logic controllers (PLCs), or any other integrated or non-integrated circuit.

During operation of the WHUD 300, the processor 310 modulates light output from the laser diodes 314, which includes a first red laser diode 314a (R), a second green laser diode 314b (G), a third blue laser diode 314c (B), and a fourth infrared laser diode 314d (IR). The first laser diode 314a emits a first (e.g., red) light signal 320, the second laser diode 314b emits a second (e.g., green) light signal 322, the third laser diode 314c emits a third (e.g., blue) light signal 324, and the fourth laser diode 314d emits a fourth (e.g., infrared) light signal 326. All four of light signals 320, 322, 324, and 326 enter or impinge on the beam combiner 316. Beam combiner 316 could for example be based on any of the beam combiners described in U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852, 282, (U.S. Publication Number 2018/0210213), and/or U.S. Non-Provisional patent application Ser. No. 15/852,205 (U.S. Publication Number 2018/0210216).

In the illustrated example, the beam combiner 316 includes optical elements 328, 330, 332, and 334. The first light signal 320 is emitted towards the first optical element 328 and reflected by the first optical element 328 of the beam combiner 316 towards the second optical element 330 of the beam combiner 316. The second light signal 322 is also directed towards the second optical element 330. The second optical element 330 is formed of a dichroic material that is transmissive of the red wavelength of the first light signal 320 and reflective of the green wavelength of the second light signal 322. Therefore, the second optical element 330 transmits the first light signal 320 and reflects the second light signal 322. The second optical element 330 combines the first light signal 320 and the second light signal 322 into a single aggregate beam (shown as separate beams for illustrative purposes) and routes the aggregate beam towards the third optical element 332 of the beam combiner 316.

The third light signal 324 is also routed towards the third optical element 332. The third optical element 332 is formed of a dichroic material that is transmissive of the wavelengths of light (e.g., red and green) in the aggregate beam comprising the first light signal 320 and the second light signal 322 and reflective of the blue wavelength of the third light signal 324. Accordingly, the third optical element 332 transmits the aggregate beam comprising the first light signal 320 and the second light signal 322 and reflects the third light signal 324. In this way, the third optical element 332 adds the third light signal 324 to the aggregate beam such that the aggregate beam comprises the light signals 320, 322, and 324 (shown as separate beams for illustrative purposes) and routes the aggregate beam towards the fourth optical element 334 in the beam combiner 316.

The fourth light signal 326 is also routed towards the fourth optical element 334. The fourth optical element 334 is formed of a dichroic material that is transmissive of the visible wavelengths of light (e.g., red, green, and blue) in the aggregate beam comprising the first light signal 320, the second light signal 322, and the third light signal 324 and reflective of the infrared wavelength of the fourth light signal 326. Accordingly, the fourth optical element 334 transmits the aggregate beam comprising the first light signal 320, the second light signal 322, and the third light signal 324 and reflects the fourth light signal 326. In this way, the fourth optical element 334 adds the fourth light signal 326 to the aggregate beam such that the aggregate beam 336 comprises portions of the light signals 320, 322, 324, and 326. The fourth optical element 334 routes the aggregate beam 336 towards the controllable scan mirror 318.

The scan mirror 318 is controllably orientable and scans (e.g. raster scans) the beam 336 to the eye 306 of the user of the WHUD 300. In particular, the controllable scan mirror 318 scans the laser light onto the transparent combiner 304 carried by the eyeglass lens 308. The scan mirror 318 may be a single bi-axial scan mirror or two single-axis scan mirrors may be used to scan the laser light onto the transparent combiner 304, for example. In at least some implementations, the transparent combiner 304 may be a holographic combiner with at least one holographic optical element. The transparent combiner 304 redirects the laser light towards a field of view of the eye 306 of the user. The laser light redirected towards the eye 306 of the user may be collimated by the transparent combiner 304, wherein the spot at the transparent combiner 304 is approximately the same size and shape as the spot at the eye 306 of the user. The laser light may be converged by the eye 306 to a focal point at the retina of eye 306 and creates an image that is focused. The visible light may create display content in the field of view of the user, and the infrared light may illuminate the eye 306 of the user for the purpose of eye tracking.

Figure 4:
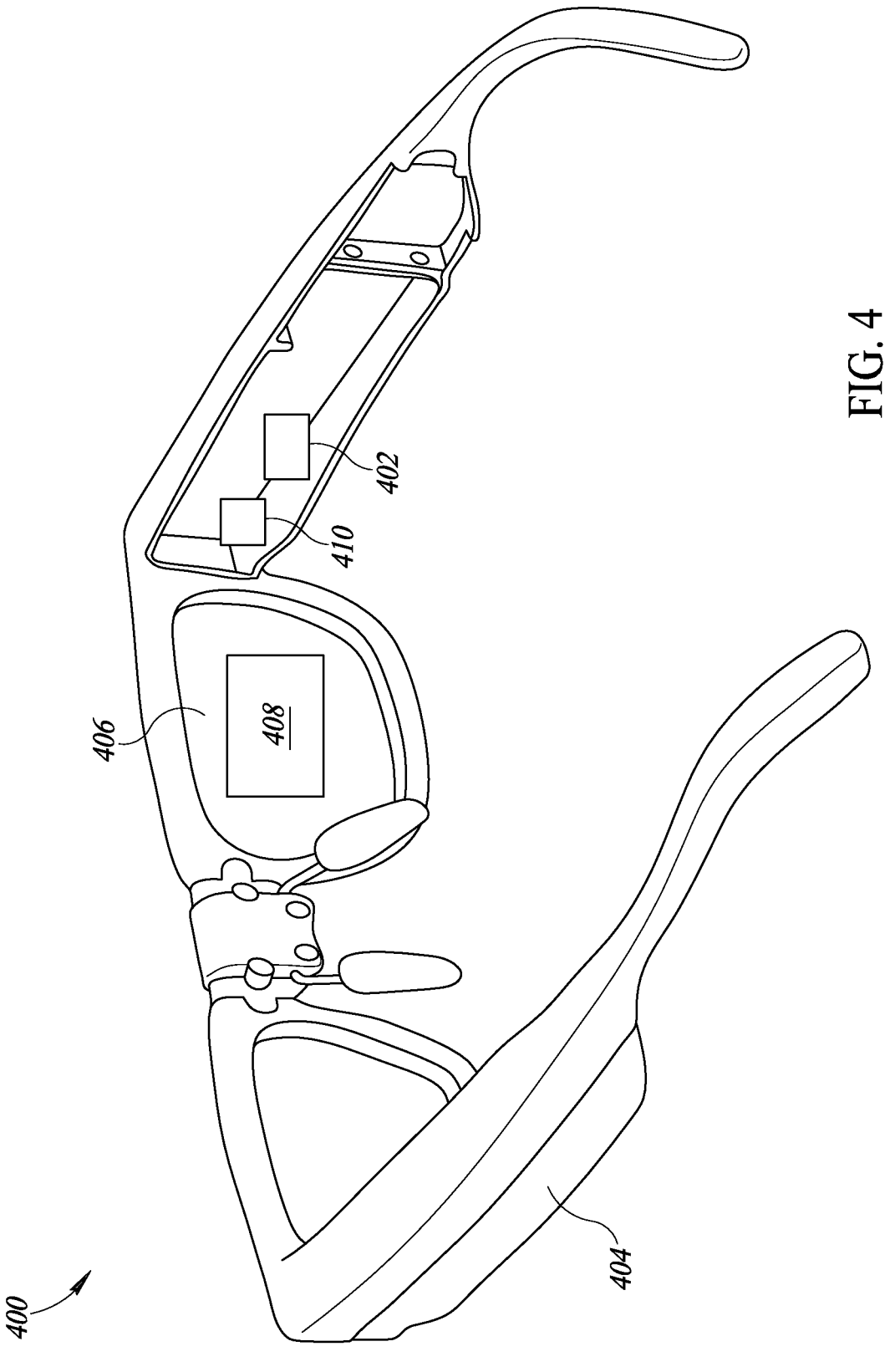
FIG. 4 is an isometric view of a wearable heads-up display with a laser projector that includes an optical engine, in accordance with the present systems, devices, and methods.

FIG. 4 is a schematic diagram of a wearable heads-up display (WHUD) 400 with a laser projector 402 in accordance with the present systems, devices, and methods. WHUD 400 includes a support structure 404 with the shape and appearance of a pair of eyeglasses that in use is worn on the head of the user. The support structure 404 carries multiple components, including eyeglass lens 406, a transparent combiner 408, the laser projector 402, and a controller or processor 410. The laser projector 402 may be similar or identical to the laser projector 302 of FIG. 3. For example, the laser projector 402 may include an optical engine, such as the optical engine 100 or the optical engine 312. The laser projector 402 may be communicatively coupled to the controller 410 (e.g., microprocessor) which controls the operation of the projector 402, as discussed above. The controller 410 may include or may be communicatively coupled to a non-transitory processor-readable storage medium (e.g., memory circuits such as ROM, RAM, FLASH, EEPROM, memory registers, magnetic disks, optical disks, other storage), and the controller may execute data and/or instruction from the non-transitory processor readable storage medium to control the operation of the laser projector 402.

In operation of the WHUD 400, the controller 410 controls the laser projector 402 to emit laser light. As discussed above with reference to FIG. 3, the laser projector 402 generates and directs an aggregate beam (e.g., aggregate beam 336 of FIG. 3) toward the transparent combiner 408 via at least one controllable mirror (not shown in FIG. 4). The aggregate beam is directed towards a field of view of an eye of a user by the transparent combiner 408. The transparent combiner 408 may collimate the aggregate beam such that the spot of the laser light incident on the eye of the user is at least approximately the same size and shape as the spot at transparent combiner 408. The transparent combiner 408 may be a holographic combiner that includes at least one holographic optical element.

Figure 5:
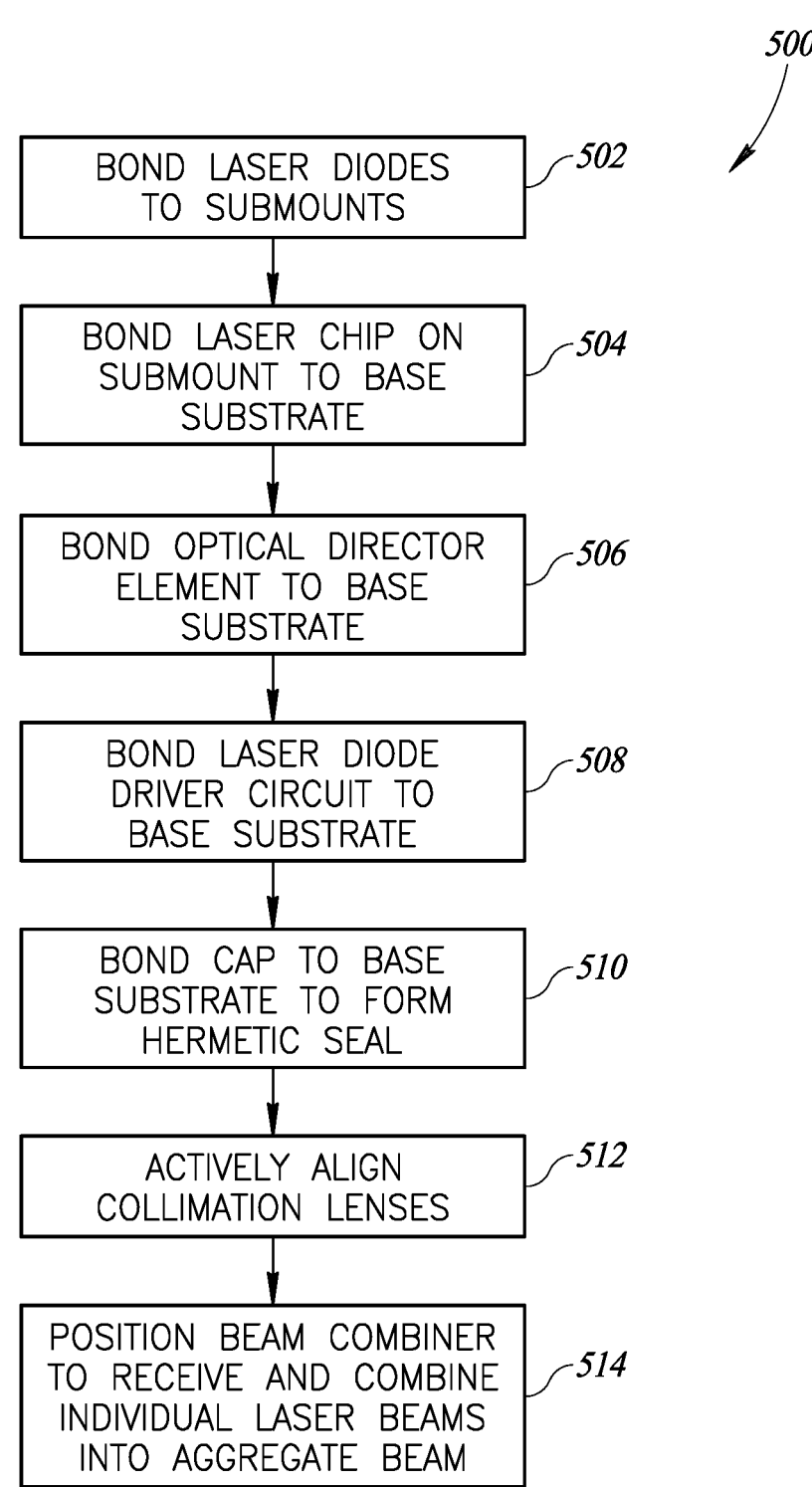
FIG. 5 is a flow diagram of a method of manufacturing an optical engine, in accordance with the present systems, devices, and methods.

FIG. 5 is a flow diagram of a method 500 of manufacturing an optical engine, in accordance with the present systems, devices, and methods. The method 500 may be implemented to manufacture the optical engine 100 of FIGS. 1A-1B or the optical engine 312 of FIG. 3, for example. It should be appreciated that methods of manufacturing optical engines according to the present disclosure may include fewer or additional acts than set forth in the method 500. Further, the acts discussed below may be performed in an order different than the order presented herein.

At 502, a plurality of laser diodes may be bonded to a respective plurality of submounts. In at least some implementations, this method may be performed by an entity different than that manufacturing the optical engine. For example, in at least some implementations, one or more of the plurality of laser diodes (e.g., green laser diode, blue laser diode) may be purchased as already assembled laser CoSs. For ease of handling and simplification of the overall process, in at least some implementations it may be advantageous to also bond laser diodes that cannot be procured on submounts to a submount as well. As a non-limiting example, in at least some implementations, one or more of the laser diodes may be bonded to a corresponding submount using an eutectic gold tin (AuSn) solder process, which is flux-free and requires heating up top 280° C.

Figure 6A:
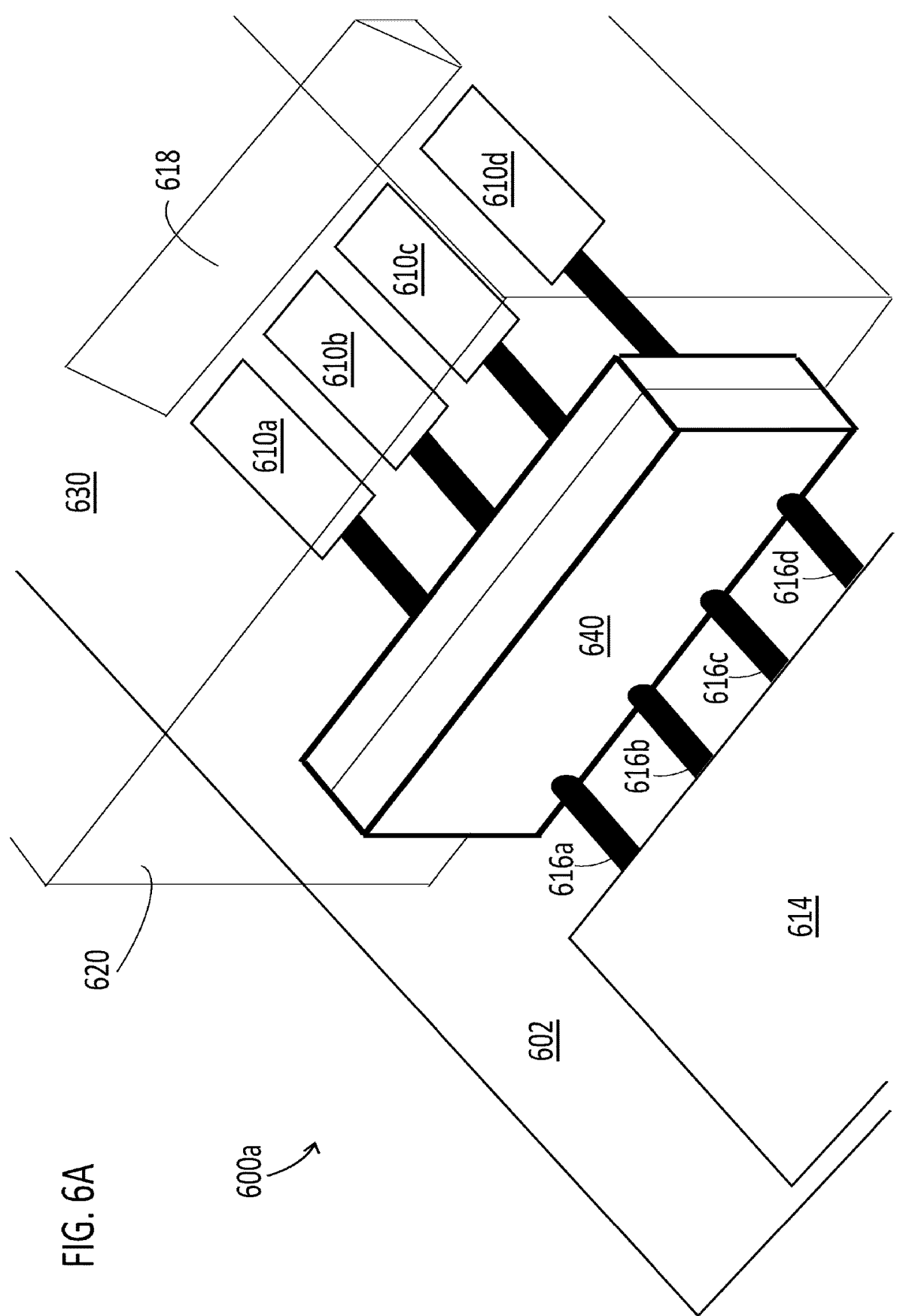
FIGS. 6A and 6B are isometric views showing implementations of optical engines having differing positions for a laser diode driver circuit in accordance with the present systems, devices, and methods.
Figure 6B:
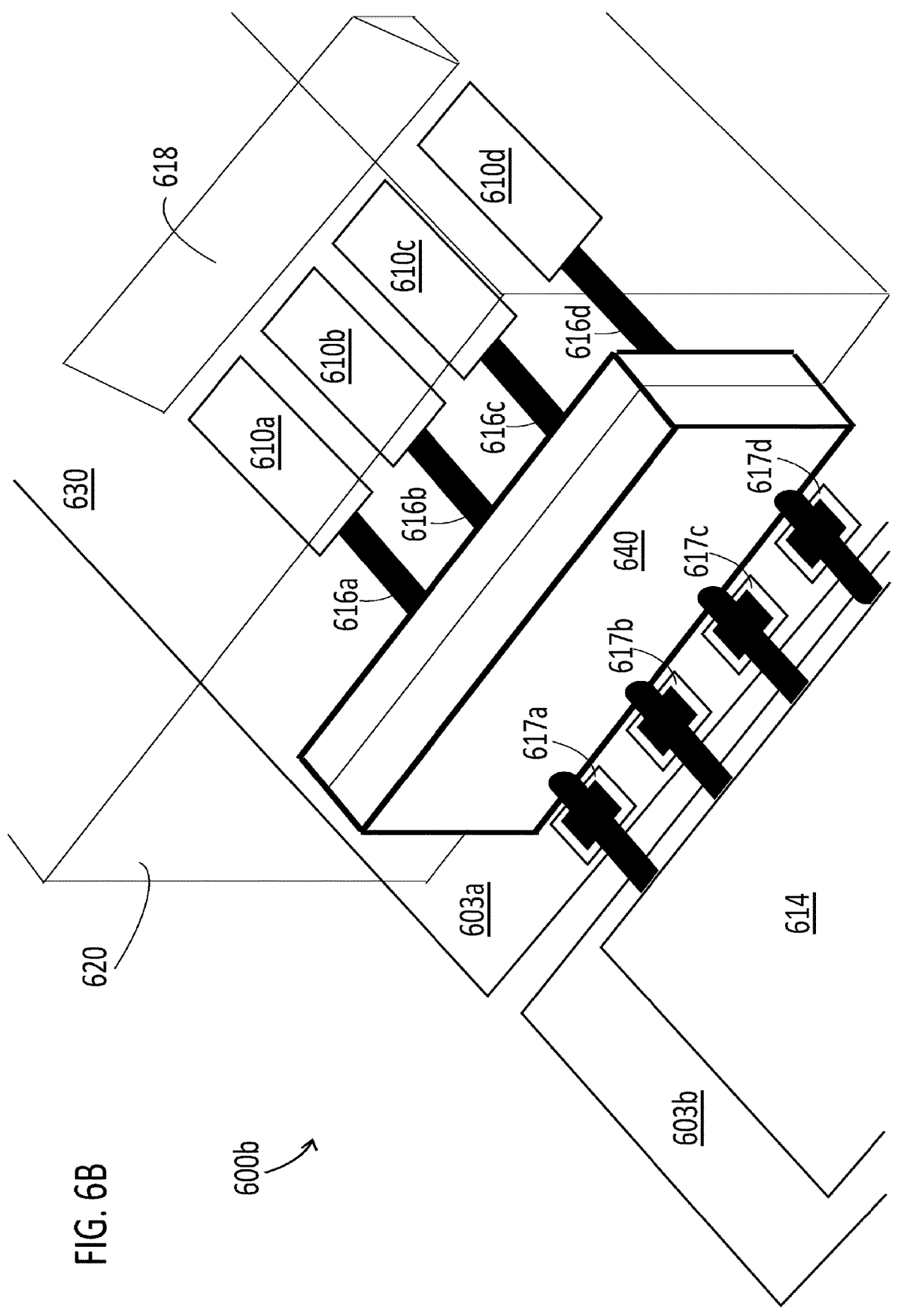

At 504, the plurality of CoSs may be bonded to a base substrate. Alternatively, act 502 could be skipped for at least one or all of the laser diodes, and act 504 could comprise bonding the at least one or all of the laser diodes directly to the base substrate, as shown in FIGS. 6A and 6B. The base substrate may be formed from a material that is RF compatible and is suitable for hermetic sealing. For example, the base substrate may be formed from low temperature co-fired ceramic (LTCC), aluminum nitride (AlN), alumina, Kovar®, etc. Since several CoSs are bonded next to each other on the same base substrate, it may be advantageous to either "step-solder" them sequentially or to use a bonding technique that does not rely on re-melting of solder materials. For step-soldering, each subsequent soldering step utilizes a process temperature that is less than the process temperatures of previous solder steps to prevent re-melting of solder materials. It may also be important that the laser diode-to-submount bonding does not re-melt during bonding of the CoSs to the base substrate. Bonding technologies other than step-soldering that may be used include parallel soldering of all CoS in reflow oven process, thermosonic or thermocompression bonding, transient liquid phase (TLP) bonding, laser soldering, etc. Some of these example bonding technologies are discussed below.

For parallel soldering of all CoSs in a reflow oven process, appropriate tooling is required to assure proper bonding and alignment during the process. An advantage of this process is the parallel and hence time efficient bonding of all CoSs at once and even many assemblies in parallel. A possible disadvantage of this process is the potential loss of the alignment of components during the reflow process. Generally, a soldering cycle ideally needs a few minutes of dwell time. Preheating may be used to reduce the soldering time, which requires a few minutes for such a process depending on the thermal mass of the components being bonded. Thus, a batch process may be used with regular soldering to reduce the assembly costs with high throughput at the expense of alignment tolerance.

For thermosonic or thermocompression bonding, thick gold metallization may be used but no extra solder layer is required. The temperatures for thermocompression bonding might be as high as 300 to 350° C. to have a good bond with a good thermal conductivity. Thermosonic bonding may be used to reduce the pressure and temperature needed for bonding, which may be required for at least some components that might not tolerate the temperatures required for thermocompression bonding.

Transient liquid phase (TLP) bonding may also be used. There are many different reaction couples that may be used, including gold-tin, copper-tin, etc. With this method, a liquid phase is formed during the bonding which will solidify at the same temperature. The re-melting temperatures of the bond are much higher than the soldering temperatures.

In at least some implementations, laser soldering may be used to bond some or all of the components of the optical engine. Generally, the thermal characteristic of the parts to be bonded may be important when implementing a laser soldering process.

Subsequent reflows of solder are not recommended due to liquid phase reaction or dissolution mechanisms which may reduce the reliability of the joint. This could result in voiding at the interface or a reduction in strength of the joint itself. In order to mitigate potential reflow dissolution problems, other options can be taken into consideration, which do not rely on extreme heating of the device and can be favorable in terms of production cost. For example, bonding of the base substrate with adhesives (electrically conductive for common mass, or non-conductive for floating) may be acceptable with respect to heat transfer and out-gassing as discussed regarding partial hermetic sealing above.

Further, in at least some implementations, a reactive multi-layer foil material (e.g., NanoFoil®) or a similar material may be used as a solder pre-form, which enables localized heat transfer. A reactive multi-layer foil material is a metallic material based on a plurality (e.g., hundreds, thousands) of reactive foils (aluminum and nickel) that enables die-attach soldering (e.g., silicon chip onto stainless steel part). In such implementations, dedicated heat transfer support metallizations may be deposited onto the two components being joined together. This method may be more advantageous for CoS-to-base substrate mounting compared to chip-to-submount bonding. Generally, bonding using reactive multi-layer foil materials enables furnace-free, low-temperature soldering of transparent or non-transparent components, without reaching the bonding temperatures for solder reflow processes. Reactive multi-layer foil materials can be patterned with a ps-laser into exact preform shapes.

At 506, the optical director element may be bonded to the base substrate proximate the laser CoSs. The optical director element may be bonded to the base substrate using any suitable bonding process, including the bonding processes discussed above with reference to act 504.

At 508, the laser diode driver circuit may optionally be bonded to the base substrate. As noted above, the laser diode driver circuit may be bonded to the base substrate such that the distance between the laser diode driver circuit and the laser CoSs is minimized. This may also comprise positioning a plurality of electrical connections which operatively couple the laser diode driver circuit to the plurality of laser diodes as shown in FIGS. 6A and 6B. In alternative implementations, the laser diode driver circuit may be bonded to a separate base substrate from the other components mentioned above as shown in FIG. 6B. The process used to bond the laser diode driver circuit to a base substrate may be any suitable bonding process, such as bonding processes commonly used to bond surface mount devices (SMD) to circuit boards. In other alternative implementations, the laser diode driver circuit may be mounted directly to a frame of a WHUD. For implementations where the laser diode drive circuit is not bonded to the same base substrate as the other components mentioned above, a plurality of electrical contacts and electrical connections could be bonded to the base substrate, each electrical connection operatively connecting a respective electrical contact to a respective laser diode. Subsequently, the at least one laser driver circuit could be operatively coupled to the electrical contacts, which will then electrically couple the laser diode drive circuit to the electrical connections and consequently to the laser diodes. An exemplary arrangement of electrical connections and electrical contacts is discussed later with reference to FIG. 6B.

At 510, the cap may be bonded to the base substrate to form a hermetic or partially hermetic seal as discussed above between the interior volume of the encapsulated package and an exterior environment. As noted above, it may be desirable to maintain a specific atmosphere for the laser diode chips for reliability reasons. In at least some implementations, adhesive sealing may be undesirable because of the high permeability of gases. This is especially the case for blue laser diodes, which emit blue laser light that may bake contamination on facets and windows, thereby reducing transparency of the optical window. However, as detailed above regarding FIGS. 1A and 1B, partial hermeticity, a particulate dust cover, or even no protective cover may be acceptable for certain applications. In implementations where the cap would be bonded over electrical connections which connect the at least one laser diode driver circuit to the plurality of laser diodes, such as when the at least one laser diode driver circuit is bonded to the same side of a base substrate as the laser diodes, or when the at least one laser diode driver circuit is coupled to electrical contacts bonded to the same side of the base substrate as the laser diodes, an electrically insulating cover can first be bonded to the base substrate over the electrical connections. Subsequently, the cap can be bonded at least partially to the electrically insulating cover, and potentially to a portion of the base substrate if the insulating cover does not fully encircle the intended interior volume. In this way, at least a portion of the cap will be bonded to the base substrate indirectly by being bonded to the electrically insulating cover. In some implementations, the entire cap could be bonded to the base substrate indirectly by being bonded to an electrically insulating cover which encircles the intended interior volume. Exemplary electrically insulating covers are discussed later with reference to FIGS. 6A and 6B.

During the sealing process, the atmosphere may be defined by flooding the package accordingly. For example, the interior volume of the encapsulated package may be flooded with an oxygen enriched atmosphere that burns off contaminants which tend to form on interfaces where the laser beam is present. The sealing itself may also be performed so as to prevent the exchange between the package atmosphere and the environment. Due to limitations concerning the allowed sealing temperature, e.g., the components inside the package should not be influenced, in at least some implementations seam welding or laser assisted soldering/diffusion bonding may be used. In at least some implementations, localized sealing using a combination of seam welding and laser soldering may be used.

At 512, the collimation lenses may be actively aligned. For example, once the laser diode driver circuit has been bonded and the cap has been sealed, the laser diodes can be turned on and the collimations lenses for each laser diode can be actively aligned. In at least some implementations, each of the collimation lenses may be positioned to optimize spot as well as pointing for each of the respective laser diodes.

At 514, the beam combiner may be positioned to receive and combine individual laser beams into an aggregate beam. As discussed above, the beam combiner may include one or more diffractive optical elements and/or one or more refractive/reflective optical elements that function to combine the different color beams into an aggregate beam. The aggregate beam may be provided to other components or modules, such as a scan mirror of a laser projector, etc.

FIGS. 6A and 6B are isometric views showing implementations of optical engines having differing positions for a laser diode driver circuit. The implementations shown in FIGS. 6A and 6B are similar in at least some respects to the implementation of FIGS. 1A and 1B, and one skilled in the art will appreciate that the description regarding FIGS. 1A and 1B is applicable to the implementations of FIGS. 6A and 6B unless context clearly dictates otherwise.

FIG. 6A shows an optical engine 600a which includes a base substrate 602. The base substrate 602 may be formed from a material that is radio frequency (RF) compatible and is suitable for hermetic sealing. For example, the base substrate 602 may be formed from low temperature co-fired ceramic (LTCC), aluminum nitride (AlN), alumina, Kovar®, etc.

The optical engine 600a also includes a plurality of laser diodes aligned in a row across a width of the optical engine 600a, including an infrared laser diode 610a, a red laser diode 610b, a green laser diode 610c, and a blue laser diode 610d. In operation, the infrared laser diode 610a provides infrared laser light, the red laser diode 610b provides red laser light, the green laser diode 610c provides green laser light, and the blue laser diode 610d provides blue laser light. Each of the laser diodes may comprise one of an edge emitter laser or a vertical-cavity surface-emitting laser (VC-SEL), for example. In FIG. 6A, laser diodes 610a, 610b, 610c, and 610d are shown as being bonded (e.g., attached) directly to base substrate 602, as described above with regards to act 504 in FIG. 5, but one skilled in the art will appreciate that laser diodes 610a, 610b, 610c, and 610d could each be mounted on a respective submount, similar to as in FIGS. 1A and 1B.

The optical engine 600a also includes a laser diode driver circuit 614 which can be bonded to the same surface of base substrate 602 as the laser diodes 610a, 610b, 610c, 610d. In alternative implementations, laser diode driver circuit 614 can be bonded to a separate base substrate, such as in FIG. 6B discussed later. The laser diode driver circuit 614 is operatively coupled to the plurality of laser diodes 610a, 610b, 610c, and 610d via respective electrical connections 616a, 616b, 616c, 616d to selectively drive current to the plurality of laser diodes. In at least some implementations, the laser diode driver circuit 614 may be positioned relative to the laser diodes 610a, 610b, 610c, and 610d to minimize the distance between the laser diode driver circuit 614 and the laser diodes. Although not shown in FIG. 6A, the laser diode driver circuit 614 may be operatively coupleable to a controller (e.g., microcontroller, microprocessor, ASIC) which controls the operation of the laser diode driver circuit 614 to selectively modulate laser light emitted by the laser diodes 610a, 610b, 610c, and 610d. In at least some implementations, the laser diode driver circuit 614 may be bonded to another portion of the base substrate 602, such as the bottom surface of the base substrate 602. In at least some implementations, the laser diode driver circuitry 614 may be remotely located and operatively coupled to the laser diodes

610a, 610b, 610c, and 610d. In order to not require the use of impedance matched transmission lines, the size scale may be small compared to a wavelength (e.g., lumped element regime), where the electrical characteristics are described by (lumped) elements like resistance, inductance, and capacitance.

Proximate the laser diodes 610a, 610b, 610c, and 610d there is positioned an optical director element 618. Like the laser diodes 610a, 610b, 610c, and 610d, the optical director element 618 is bonded to the top surface of the base substrate 602. The optical director element 618 may be bonded proximate to or adjacent each of the laser diodes 610a, 610b, 610c, and 610d. In the illustrated example, the optical director element 618 has a triangular prism shape that includes a plurality of planar faces, similar to optical director element 118 in FIGS. 1A and 1B. The optical director element 618 may comprise a mirror or a prism, for example.

The optical engine 600a also includes a cap 620 similar to cap 120 in FIGS. 1A and 1B. For clarity, cap 620 is shown as being transparent in FIG. 6A, though this is not necessarily the case, and cap 620 can be formed of an opaque material. Cap 620 includes a horizontal optical window 630 that forms the "top" of the cap 620. Although optical window 630 in FIG. 6A is shown as comprising the entire top of cap 620, in alternative implementations optical window could comprise only a portion of the top of cap 620. Cap 620 including optical window 630 defines an interior volume sized and dimensioned to receive the plurality of laser diodes 610a, 610b, 610c, 610d, and the optical director element 618. Cap 620 is bonded to the base substrate 602 to provide a hermetic or partially hermetic seal between the interior volume of the cap 620 and a volume exterior to the cap 620.

The optical director element 618 is positioned and oriented to direct (e.g., reflect) laser light received from each of the plurality of laser diodes 610a, 610b, 610c, and 610d upward toward the optical window 630 of the cap 620, wherein the laser light exits the interior volume, similar to FIGS. 1A and 1B.

The cap 620 may have a round shape, rectangular shape, or other shape, similarly to as described regarding FIGS. 1A and 1B above. The optical window 630 may comprise an entire top of the cap 620, or may comprise only a portion thereof. In at least some implementations, the optical window 630 may be located on a sidewall of cap 620 rather than positioned as a top of the cap 620, and the laser diodes 610a, 610b, 610c, 610d and/or the optical director element 618 may be positioned and oriented to direct the laser light from the laser diodes toward the optical window on the sidewall. In at least some implementations, the laser diodes 610a, 610b, 610c, and 610d may be positioned and oriented to direct the laser light from the laser diode toward the optical window on the sidewall without optical director element 618. In at least some implementations, the cap 620 may include a plurality of optical windows instead of a single optical window.

The optical engine 600a can also include four collimation/pointing lenses similarly to as discussed regarding FIGS. 1A and 1B above. Each of the collimation lenses can be operative to receive laser light from a respective one of the laser diodes 610a, 610b, 610c, or 610d, and to generate a single color beam.

The optical engine 600a may also include, or may be positioned proximate to, a beam combiner that is positioned and oriented to combine the light beams received from each of the collimation lenses or laser diodes 610a, 610b, 610c, or 610*d* into a single aggregate beam. As an example, the beam combiner may include one or more diffractive optical elements (DOE) and/or one or more refractive/reflective optical elements that combine the different color beams in order to achieve coaxial superposition. An example beam combiner is shown in FIG. 3 and discussed above.

In at least some implementations, the laser diodes 610*a*, 610*b*, 610*c*, 610*d*, the optical director element 618, and/or the collimation lenses may be positioned differently. As noted above, laser diode driver circuit 614 may be mounted on a top surface or a bottom surface of the base substrate 602, depending on the RF design and other constraints (e.g., package size). In at least some implementations, the optical engine 600*a* may not include the optical director element 618, and the laser light may be directed from the laser diodes 610*a*, 610*b*, 610*c*, and 610*d* toward collimation lenses without requiring an intermediate optical director element. Additionally, in at least some implementations, one or more of the laser diodes may be mounted directly on the base substrate 602 with a submount.

Optical engine 600*a* in FIG. 6A also includes an electrically insulating cover 640. In FIG. 6A, laser diodes 610*a*, 610*b*, 610*c*, and 610*d* are each connected to laser diode driver circuitry 614 by a respective electrical connection 616*a*, 616*b*, 616*c*, or 616*d* positioned as described above with regards to act 508 in FIG. 5. Electrical connections 616*a*, 616*b*, 616*c*, and 616*d* run across a surface of the base substrate 602. As described above with regards to act 510 in FIG. 5, electrically insulating cover 640 is placed, adhered, formed, or otherwise positioned over electrical connections 616*a*, 616*b*, 616*c*, and 616*d*, such that each of the electrical connections 616*a*, 616*b*, 616*c*, and 616*d* run through electrically insulating cover 640. Also as described above with regards to act 510 in FIG. 5, cap 620 is placed, adhered, formed, or otherwise positioned over electrically insulating cover 640, such that cap 620 does not contact any of the electrical connections 616*a*, 616*b*, 616*c*, or 616*d*. For clarity, cap 620 is shown as being transparent in FIG. 6A, though this is not necessarily the case, and cap 620 can be formed of an opaque material. Electrically insulating cover 640 can be formed of a material with low electrical permittivity such as a ceramic, such that electrical signals which run through electrical connections 616*a*, 616*b*, 616*c*, and 616*d* do not run into or through electrically insulating cover 640. In this way, electrical signals which run through electrical connections 616*a*, 616*b*, 616*c*, and 616*d* can be prevented from running into or through cap 620, which can be formed of an electrically conductive material. Although FIG. 6A shows electrically insulating cover 640 as extending along only part of a side of cap 620, one skilled in the art will appreciate that electrically insulating cover 640 can extend along an entire side length of cap 620.

One skilled in the art will appreciate that the positions of laser diode driver circuitry 614, electrical connections 616*a*, 616*b*, 616*c*, 616*d*, and electrically insulating cover 640 as shown in FIG. 6A could also be applied in other implementations of the subject systems, devices and methods. For example, in the implementations of FIGS. 1A and 1B, laser diode driver circuitry 114 could be positioned on top surface 104 of base substrate 102, and electrical connections 116 could run across top surface 104 under an electrically insulating cover, such that electrical connections 116 do not contact any conductive portion of cap 120.

FIG. 6B is an isometric view an optical engine 600*b* similar in at least some respects to optical engine 600*a* of FIG. 6A. One skilled in the art will appreciate that the description of optical engine 600*a* in FIG. 6A is applicable to optical engine 600*b* in FIG. 6B, unless context clearly dictates otherwise. The optical engine 600*b* includes a base substrate 603*a*. Similar to base substrate 602 in FIG. 6A, base substrate 603*a* may be formed from a material that is radio frequency (RF) compatible and is suitable for hermetic sealing. For example, the base substrate 603*a* may be formed from low temperature co-fired ceramic (LTCC), alumina, Kovar®, etc.

One difference between optical engine 600*b* in FIG. 6B and optical engine 600*a* in FIG. 6A relates to what components are bonded (e.g. attached) to base substrate 603*a*. In optical engine 600*b*, each of: laser diodes 610*a*, 610*b*, 610*c*, 610*d*; cap 620; electrical connections 616*a*, 616*b*, 616*c*, 616*d*; and electrically insulating cover 640 are bonded (e.g., attached) to base substrate 603*a*. However, laser diode driver circuit 614 is not necessarily bonded directly to base substrate 603*a*. Instead, laser diode driver circuit 614 could be bonded to a separate base substrate 603*b*. Similar to base substrate 602 in FIG. 6A and base substrate 603*a* in FIG. 6B, base substrate 603*b* may be formed from a material that is radio frequency (RF) compatible and is suitable for hermetic sealing. For example, the base substrate 603*b* may be formed from low temperature co-fired ceramic (LTCC), alumina, Kovar®, etc. In an alternative implementation, laser diode drive circuit 614 may not need to be bonded to a substrate at all, and could simply be mounted directly within a frame of a WHUD.

For implementations where laser diode drive circuit 614 is not bonded to base substrate 603*a*, electrical contacts 617*a*, 617*b*, 617*c*, and 617*d* could be bonded to base substrate 603*a*, each at an end of a respective electrical connection 616*a*, 616*b*, 616*c*, or 616*d* as described above with regards to act 508 in FIG. 5. In this way, electrical contacts 617*a*, 617*b*, 617*c*, and 617*d* could be used to electrically couple laser diode drive circuit 614 to electrical connections 616*a*, 616*b*, 616*c*, and 616*d* and consequently laser diodes 610*a*, 610*b*, 610*c*, and 610*d*.

Throughout this application, collimation lenses have been represented in the Figures by a simple curved lens shape. However, the subject systems, devices, and methods can utilize more advanced collimation schemes, as appropriate for a given application.

Figure 7:
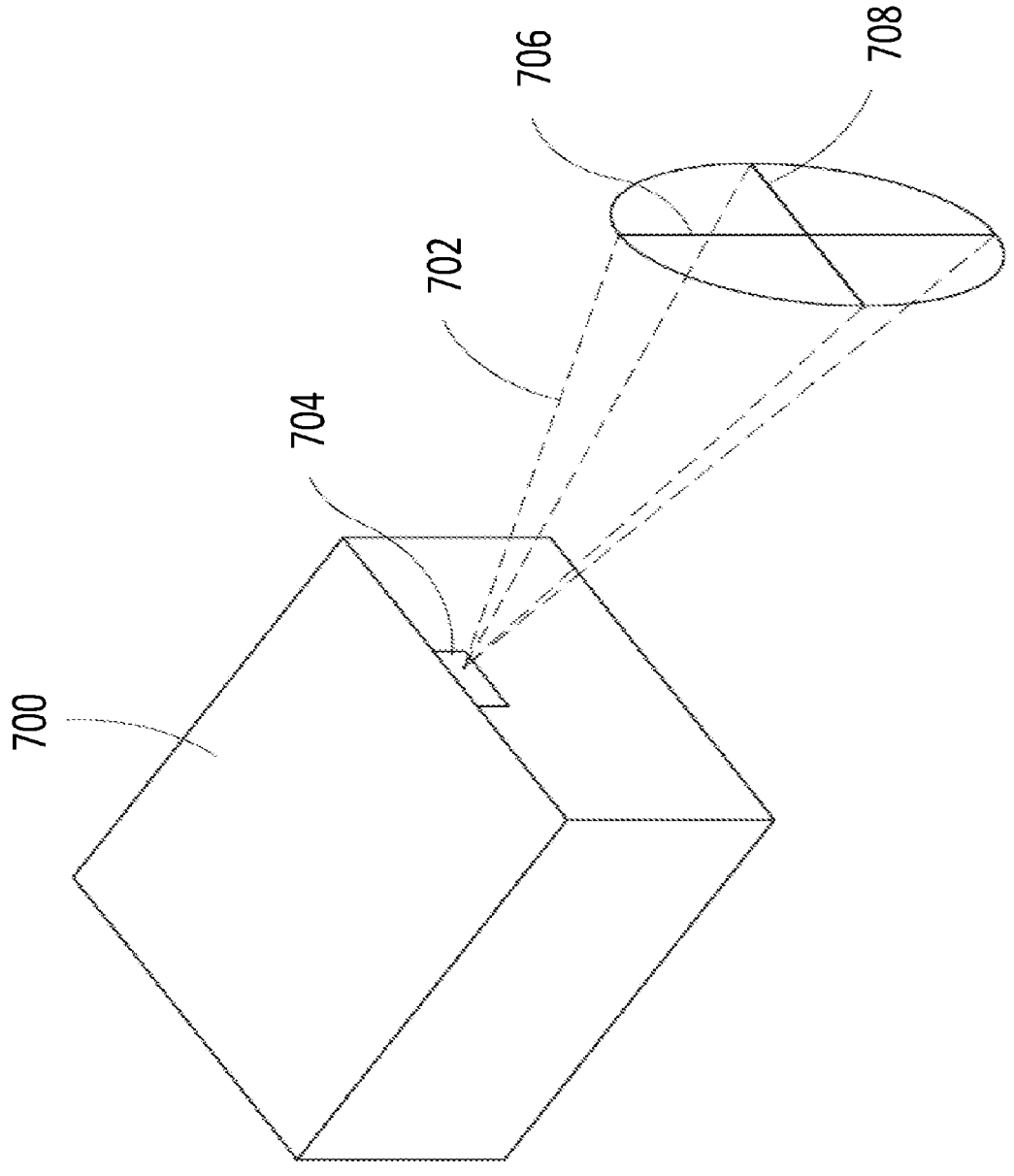
FIG. 7 is an isometric view of a laser diode, showing a fast axis and a slow axis of a light beam generated by the laser diode, in accordance with the present systems, devices, and methods.

FIG. 7 shows an exemplary situation where using an advanced collimation scheme would be helpful. FIG. 7 is an isometric view of a laser diode 700. The laser diode 700 may be similar or identical to the various laser diodes discussed herein. The laser diode 700 outputs a laser light beam 702 via an output facet 704 of the laser diode. FIG. 7 shows the divergence of the light 702 emitting from the laser diode 700. As shown, the light beam 702 may diverge by a substantial amount along a fast axis 706 (or perpendicular axis) and by a lesser amount in the slow axis 708 (parallel axis). As a non-limiting example, in at least some implementations, the light beam 702 may diverge with full width half maximum (FWHM) angles of up to 40 degrees in the fast axis direction 706 and up to 10 degrees in the slow axis direction 708. This divergence results in a rapidly expanding elliptical cone.

Figure 8A:
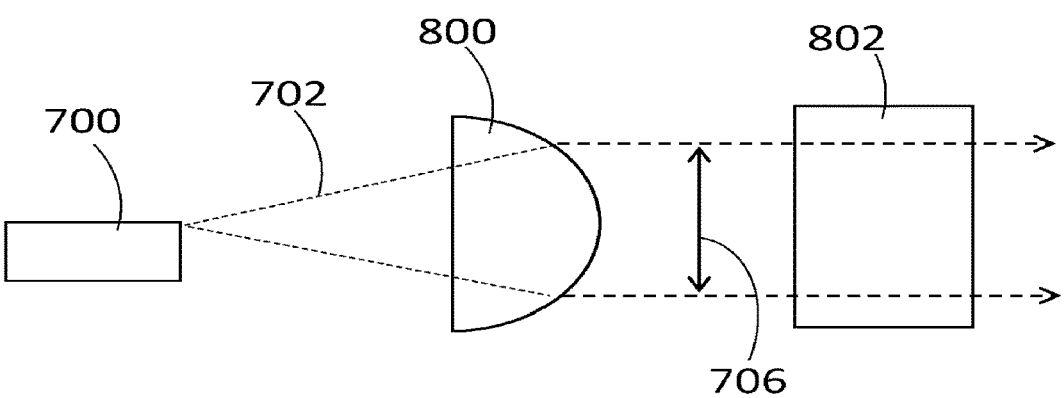
FIG. 8A is a side sectional view of a set of collimation lenses for collimating a beam of light separately along different axes.
Figure 8B:
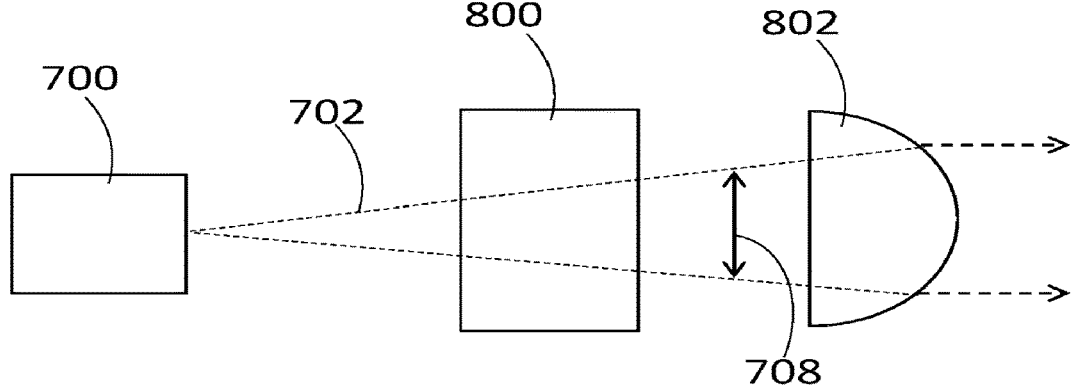
FIG. 8B is a top sectional elevational view of the set of collimation lenses of FIG. 8A.

FIGS. 8A and 8B show an exemplary collimation scheme that can be used to circularize and collimate an elliptical beam such as that shown in FIG. 7. FIG. 8A illustrates an orthogonal view of the fast axis 706 of light beam 702 emitted from laser diode 700. FIG. 8B illustrates an orthogonal view of the slow axis 708 of light beam 702 emitted from laser diode 700. As shown in FIG. 8A, a first lens 800 collimates light beam 702 along fast axis 706. As shown in FIG. 8B, first lens 800 is shaped so as to not substantially influence light beam 702 along slow axis 708. Subsequently, as shown in FIG. 8B, light beam 702 is collimated along slow axis 708 by a second lens 802. As shown in FIG. 8A, second lens 802 is shaped so as to not substantially influence light beam 702 along fast axis 706. In essence, light beam 702 is collimated along fast axis 706 separately from slow axis 708. By collimating light beam 702 along fast axis 706 separately from slow axis 708, the collimation power applied to each axis can be independently controlled by controlling the power of lens 800 and lens 802 separately. Further, spacing between each of laser diode 700, lens 800, and lens 802 can be controlled to collimate light beam 702 to a certain width in each axis separately. If light beam 702 is collimated along fast axis 706 to the same width as slow axis 708, light beam 702 can be circularized. Because light beam 702 will typically diverge faster in the fast axis 706, it is generally preferable to collimate light beam 702 along fast axis 706 first, then collimate light beam 702 along slow axis 708 after. However, it is possible in certain applications to collimate light beam 702 along slow axis 708 first, and subsequently collimate light beam 702 along fast axis 706 after. This can be achieved by reversing the order of first lens 800 with second lens 802, with respect to the path of travel of light beam 702.

Figure 8C:
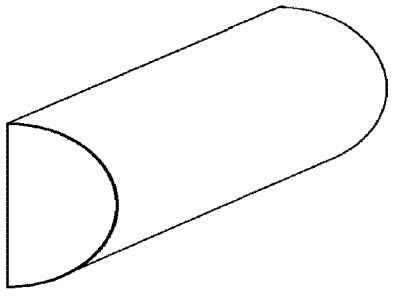
FIGS. 8C and 8D are isometric views of exemplary lens shapes which could be used as lenses in the implementation of FIGS. 8A and 8B.
Figure 8D:
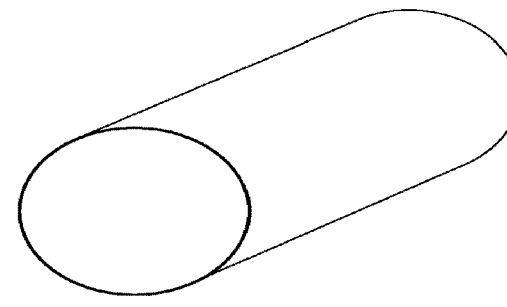

FIGS. 8C and 8D are isometric views which illustrate exemplary shapes for lenses 800 and 802. Each of lens 800 and 802 can be for example a half-cylinder as in FIG. 8C, a full cylinder as in FIG. 8D, a quarter cylinder, a three-quarter cylinder, any other partial cylinder, or any other appropriate shape. Lenses 800 and 802 can be similarly shaped, or can have different shapes.

FIGS. 9A and 9B illustrate an alternative collimation scheme. FIG. 9A illustrates an orthogonal view of the fast axis 706 of light beam 702 emitted from laser diode 700. FIG. 9B illustrates an orthogonal view of the slow axis 708 of light beam 702 emitted from laser diode 700. As shown in FIG. 9A, a first lens 900 redirects light beam 702 along fast axis 706, to reduce divergence of light beam 702 along fast axis 706. As shown in FIG. 9B, first lens 900 is shaped so as to not substantially influence light beam 702 along slow axis 708. Preferably, first lens 900 will reduce divergence of light beam 702 along fast axis 706 to match divergence of light beam 702 along slow axis 708. That is, first lens 900 preferably circularizes light beam 702. Subsequently, as shown in FIGS. 9A and 9B, light beam 702 is collimated along both fast axis 706 and slow axis 708 by a second lens 902. As shown in FIGS. 9A and 9B, second lens 902 is shaped similarly with respect to both the fast axis 706 and the slow axis 708, to evenly collimate light beam 702. In essence, first lens 900 circularizes light beam 702, and subsequently second lens 902 collimates light beam 702 along both axes. First lens 900 can for example be shaped similarly to lens 800 or lens 802 discussed above, and shown in FIGS. 8C and 8D. Second lens 902 can for example be shaped as a double convex lens as illustrated in FIG. 9C, or a single convex lens (convex on either side) as illustrated in FIG. 9D, or any other appropriate shape of collimating lens.

The collimation schemes illustrated in FIGS. 8A-8D and 9A-9D, and discussed above could be used in place of any of the collimation lenses described herein, including at least collimation lenses 136a, 136b, 136c, 136d.

A person of skill in the art will appreciate that the teachings of the present systems, methods, and devices may be modified and/or applied in additional applications beyond the specific WHUD implementations described herein. In some implementations, one or more optical fiber(s) may be used to guide light signals along some of the paths illustrated herein.

The WHUDs described herein may include one or more sensor(s) (e.g., microphone, camera, thermometer, compass, altimeter, and/or others) for collecting data from the user's environment. For example, one or more camera(s) may be used to provide feedback to the processor of the WHUD and influence where on the display(s) any given image should be displayed.

The WHUDs described herein may include one or more on-board power sources (e.g., one or more battery(ies)), a wireless transceiver for sending/receiving wireless communications, and/or a tethered connector port for coupling to a computer and/or charging the one or more on-board power source(s).

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, at least the following are incorporated herein by reference in their entirety: U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852,282, (U.S. Publication Number 2018/0210213), U.S. Non-Provisional patent application Ser. No. 15/852,205 (U.S. Publication Number 2018/0210216), U.S. Provisional Patent Application Ser. No. 62/575,677, U.S. Provisional Patent Application Ser. No. 62/591,550, U.S. Provisional Patent Application Ser. No. 62/597,294, U.S. Provisional Patent Application Ser. No. 62/608,749, U.S. Provisional Patent Application Ser. No. 62/609,870, U.S. Provisional Patent Application Ser. No. 62/591,030, U.S. Provisional Patent Application Ser. No. 62/620,600, U.S. Provisional Patent Application Ser. No. 62/576,962, U.S. Provisional Patent Application Ser. No. 62/760,835, U.S. Non-Provisional patent application Ser. No. 16/168,690, U.S. Non-Provisional patent application Ser. No. 16/171,206, and/or PCT Patent Application PCT/CA2018051344. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optical engine comprising:
a base substrate;
a plurality of laser diodes attached directly or indirectly to the base substrate;
a cap comprising at least one wall and an optical window, the cap attached to the base substrate, the at least one wall, the optical window, and at least a portion of the base substrate together delimiting an interior volume sized and dimensioned to receive at least the plurality of laser diodes, an interface between the cap and the base substrate providing a hermetic or partially hermetic seal between the interior volume of the cap and a volume exterior to the cap, and the optical window positioned and oriented to allow light emitted from the laser diodes to exit the interior volume via the optical window; and
a plurality of collimation lenses adjacent to the optical window, each of the plurality of collimation lenses positioned and oriented to receive light from a corresponding one of the laser diodes through the optical window.

2. The optical engine of claim 1, further comprising:
a plurality of chip submounts, wherein the plurality of laser diodes are attached to the base substrate via the plurality of chip submounts.

3. The optical engine of claim 1, wherein each of the plurality of collimation lenses is attached to the optical window.

4. The optical engine of claim 1, further comprising:
a beam combiner configured to combine light beams received from each of the collimation lenses into a single aggregate beam.

5. The optical engine of claim 1, further comprising:
an optical director element attached to the base substrate proximate the plurality of laser diodes, the optical director element positioned and oriented to direct laser light from the plurality of laser diodes toward the optical window of the cap.

6. The optical engine of claim 1, further comprising:
at least one laser diode driver circuit configured to selectively drive current to the plurality of laser diodes, wherein the cap is attached to a first surface of the base substrate, the at least one laser diode driver circuit is attached to a second surface of the base substrate, and the first surface of the base substrate is opposite the second surface of the base substrate.

7. The optical engine of claim 6, further comprising:
a plurality of electrical connections attached to the first surface of the base substrate, each electrical connection of the plurality of electrical connections coupled to a respective laser diode of the plurality of laser diodes, wherein the at least one laser diode driver circuit is coupled to the plurality of laser diodes via the plurality of electrical connections.

8. The optical engine of claim 7, further comprising:
an electrically insulating cover disposed over the plurality of electrical connections, wherein the cap is attached to the electrically insulating cover.

9. The optical engine of claim 7 further comprising:
a plurality of electrical contacts attached to the base substrate, each electrical contact coupled to a respective one of the plurality of electrical connections, wherein the at least one laser diode driver circuit is coupled to the plurality of laser diodes via the plurality of electrical contacts and the plurality of electrical connections.

10. A laser projector comprising:
a plurality of laser diodes attached directly or indirectly to a base substrate;
at least one laser diode driver circuit configured to selectively drive current to the laser diodes;
a cap comprising at least one wall and at least one optical window, the cap attached to the base substrate, wherein the at least one wall, the at least one optical window, and at least a portion of the base substrate together delimit an interior volume, the plurality of laser diodes are disposed in the interior volume, an interface between the cap and the base substrate provides a hermetic or partially hermetic seal between the interior volume of the cap and a volume exterior to the cap, and the optical window is positioned and oriented to allow light emitted from the laser diodes to exit the interior volume via the optical window;

a plurality of collimation lenses adjacent the at least one optical window, each of the plurality of collimation lenses positioned and oriented to receive light from a corresponding one of the laser diodes through the at least one optical window;

a beam combiner configured to combine light beams received via each of the collimation lenses into a single aggregate beam; and at least one scan mirror disposed to receive laser light from the plurality of laser diodes, the at least one scan mirror controllably orientable to redirect the laser light over a range of angles.

11. The laser projector of claim 10, further comprising:

a plurality of electrical connections attached to the base substrate, each electrical connection of the plurality of electrical connections coupled to a respective laser diode of the plurality of laser diodes, wherein the at least one laser diode driver circuit is coupled to the plurality of laser diodes via the plurality of electrical connections; and an electrically insulating cover attached to the base substrate and disposed over the plurality of electrical connections.

12. The laser projector of claim 11, wherein the at least one laser diode driver circuit is attached to a first surface of the base substrate, the plurality of electrical connections is attached to the first surface of the base substrate, the cap is attached to the first surface of the base substrate, and the cap is attached to the electrically insulating cover.

13. The laser projector of claim 11, further comprising:

a plurality of electrical contacts attached to the base substrate, each electrical contact of the plurality of electrical contacts coupled to a respective one of the plurality of electrical connections, wherein the at least one laser diode driver circuit is coupled to the plurality of laser diodes via the plurality of electrical contacts and the plurality of electrical connections.

14. A wearable heads-up display (WHUD) comprising:

a support structure dimensioned to be worn on the head of a user; and a laser projector attached to the support structure, the laser projector comprising:

a plurality of laser diodes attached directly or indirectly to a base substrate;

at least one laser diode driver circuit configured to selectively drive current to the laser diodes;

a cap comprising at least one wall and at least one optical window, the cap attached to the base substrate, wherein the at least one wall, the at least one optical window, and at least a portion of the base substrate together delimit an interior volume, the plurality of laser diodes are disposed in the interior volume, an interface between the cap and the base substrate provides a hermetic or partially hermetic seal between the interior volume of the cap and a volume exterior to the cap, and the optical window is positioned and oriented to allow light emitted from the laser diodes to exit the interior volume via the optical window; and a plurality of collimation lenses adjacent the at least one optical window, each of the plurality of collimation lenses positioned and oriented to receive light from a corresponding one of the laser diodes through the at least one optical window.

15. The WHUD of claim 14, further comprising:

at least one scan mirror disposed to receive laser light from the plurality of laser diodes, the at least one scan mirror controllably orientable to redirect the laser light over a range of angles.

16. The WHUD claim 14, further comprising:

a plurality of electrical connections attached to the base substrate, each electrical connection of the plurality of electrical connections coupled to a respective laser diode of the plurality of laser diodes, wherein the at least one laser diode driver circuit is coupled to the plurality of laser diodes via the plurality of electrical connections; and an electrically insulating cover attached to the base substrate and disposed over the plurality of electrical connections.

17. The WHUD of claim 16, wherein the at least one laser diode driver circuit is attached to a first surface of the base substrate, the plurality of electrical connections is attached to the first surface of the base substrate, the cap is attached to the first surface of the base substrate, and the cap is attached to the electrically insulating cover.

18. The WHUD of claim 16, further comprising:

a plurality of electrical contacts attached to the base substrate, each electrical contact of the plurality of electrical contacts coupled to a respective one of the plurality of electrical connections, wherein the at least one laser diode driver circuit is coupled to the plurality of laser diodes via the plurality of electrical contacts and the plurality of electrical connections.

19. The WHUD of claim 14, wherein the support structure comprises an eyeglasses frame.

* * * * *